(12) United States Patent
Kasahara et al.

(10) Patent No.: US 9,564,870 B2
(45) Date of Patent: Feb. 7, 2017

(54) STRUCTURAL BODY AND WIRING BOARD

(71) Applicant: NEC CORPORATION, Tokyo (JP)

(72) Inventors: Yoshiaki Kasahara, Tokyo (JP);
Hiroshi Toyao, Tokyo (JP)

(73) Assignee: NEC CORPORATION, Tokyo (JP)

( * ) Notice: Subject to any disclaimer, the term of this patent is extended or adjusted under 35 U.S.C. 154(b) by 39 days.

(21) Appl. No.: 14/412,311

(22) PCT Filed: Mar. 28, 2013

(86) PCT No.: PCT/JP2013/002111
§ 371 (c)(1),
(2) Date: Dec. 31, 2014

(87) PCT Pub. No.: WO2014/006796
PCT Pub. Date: Jan. 9, 2014

(65) Prior Publication Data
US 2015/0155845 A1    Jun. 4, 2015

(30) Foreign Application Priority Data

Jul. 2, 2012 (JP) .................................. 2012-148869

(51) Int. Cl.
*H01P 1/203* (2006.01)
*H01P 3/08* (2006.01)
(Continued)

(52) U.S. Cl.
CPC ............ *H03H 7/0161* (2013.01); *H01P 1/203* (2013.01); *H01P 1/2005* (2013.01); *H01P 3/08* (2013.01);
(Continued)

(58) Field of Classification Search
CPC ..... H01P 1/203; H01P 1/20327; H01P 1/2005; H01P 3/08; H03H 7/0115; H03H 7/0161
(Continued)

(56) References Cited

U.S. PATENT DOCUMENTS 7,215,007 B2    5/2007    McKinzie, III et al.
2005/0205292 A1    9/2005    Rogers et al.
(Continued)

FOREIGN PATENT DOCUMENTS

JP    2008-236027 A    10/2008
JP    2008236027 A    10/2008
(Continued)

OTHER PUBLICATIONS

Hiroshi et al.; WO2011/152055 (English Translation); Dec. 8, 2011.*

(Continued)

*Primary Examiner* — Robert Pascal
*Assistant Examiner* — Rakesh Patel
(74) *Attorney, Agent, or Firm* — Sughrue Mion, PLLC

(57) ABSTRACT

A second conductor plane (102) is formed in a layer different from a layer in which a first conductor plane (101) is formed, and faces the first conductor plane (101). A first transmission line (104) is formed in a layer different from the layers in which the first conductor plane (101) and the second conductor plane (102) are formed, and faces the second conductor plane (102), and one end thereof is an open end. A conductor via (106) connects the other end of the first transmission line (104) and the first conductor plane (101). An insular conductor (112) is connected to a portion of the first transmission line (104) other than a portion thereof at which the transmission line (104) is attached to the conductor via (106), is located in a layer different from the layer in which the second conductor plane (102) is located, and faces the second conductor plane (102).

10 Claims, 38 Drawing Sheets

(51) Int. Cl.
*H03H 7/01* (2006.01)
*H01P 1/20* (2006.01)
*H01Q 15/00* (2006.01)
*H05K 1/02* (2006.01)
*H05K 1/16* (2006.01)

(52) U.S. Cl.
CPC ........ *H01Q 15/008* (2013.01); *H01Q 15/0066* (2013.01); *H03H 7/0115* (2013.01); *H05K 1/0236* (2013.01); *H05K 1/162* (2013.01); *H05K 2201/09254* (2013.01); *H05K 2201/09263* (2013.01); *H05K 2201/09672* (2013.01); *H05K 2201/09727* (2013.01); *H05K 2201/09781* (2013.01)

(58) Field of Classification Search
USPC ........ 333/204, 205, 219, 235, 246, 176, 238
See application file for complete search history.

(56) References Cited

U.S. PATENT DOCUMENTS

2007/0176827 A1 8/2007 Itoh et al.
2009/0085691 A1* 4/2009 Kim .................. H05K 1/0231
333/185
2009/0212885 A1 8/2009 Hwang et al.
2012/0032865 A1 2/2012 Toyao et al.
2013/0140071 A1 6/2013 Toyao et al.

FOREIGN PATENT DOCUMENTS

JP 2010-10183 A 1/2010
JP 2010-199881 A 9/2010
WO 2012042717 A1 4/2012

OTHER PUBLICATIONS

International Search Report for PCT/JP2013/002111 dated Jul. 2, 2013 [PCT/ISA/210].
Communication dated Jan. 4, 2016 from the European Patent Office in counterpart application No. 13813272.5.
Kasahara Y et al: "Open stub electromagnetic bandgap structure for 2.4/5.2 GHz dual-band suppression of power plane noise", Electrical Design of Advanced Packaging and Systems Symposium (EDAPS), 2011 IEEE, Dec. 12, 2011, pp. 1-4 URL, http://ieeexplore.ieee.org/Xplore/home.j sp.

* cited by examiner

Fig.6
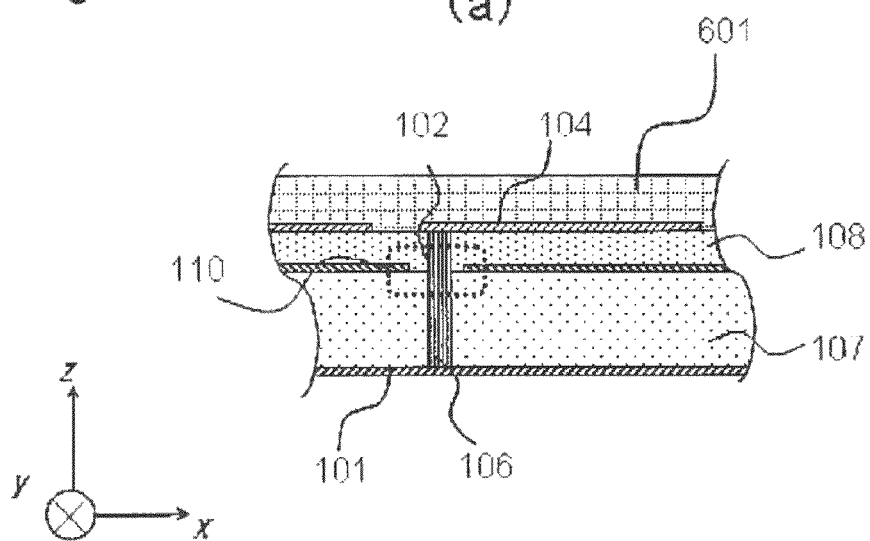
(a)
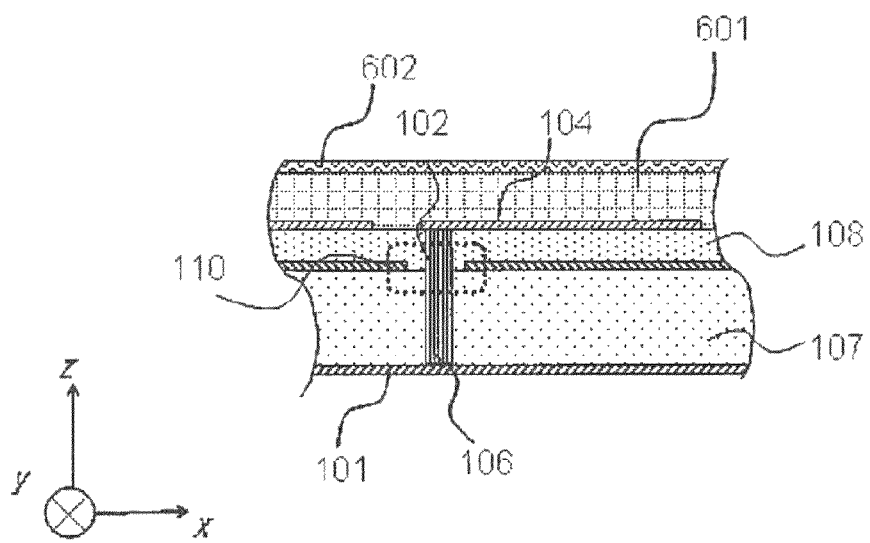
(b)

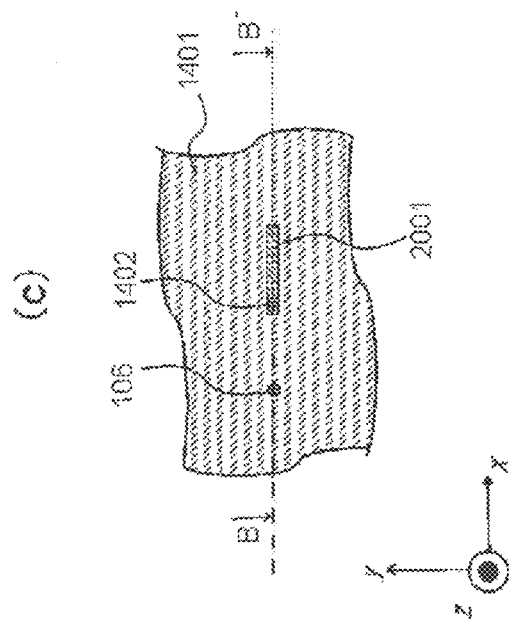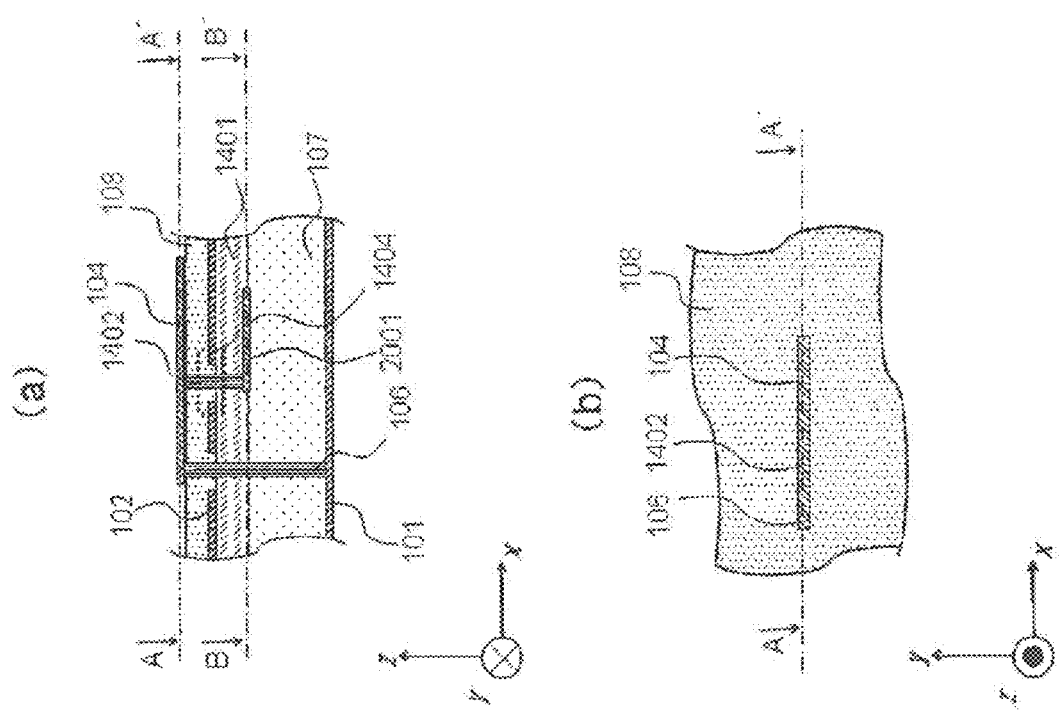
Fig.26

Fig. 29
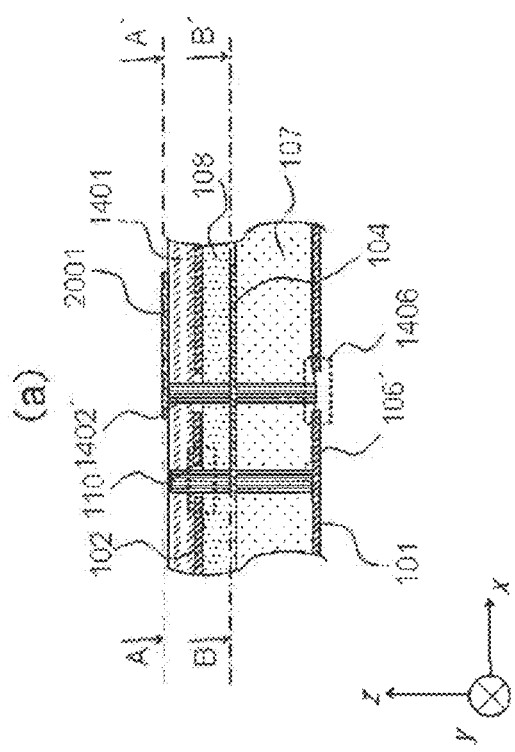
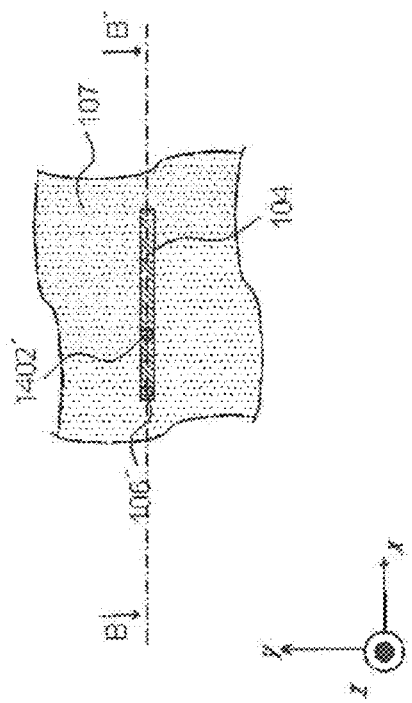
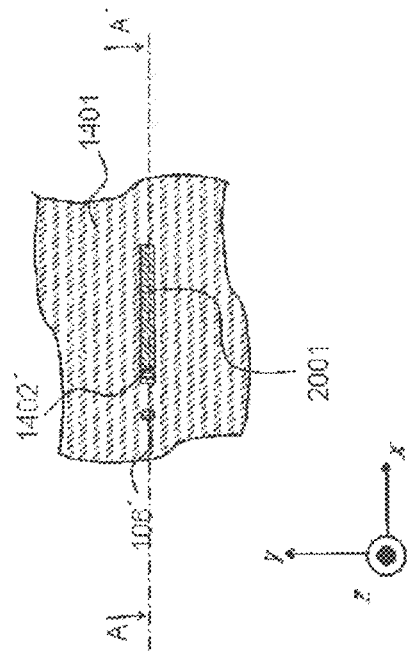

Fig. 30
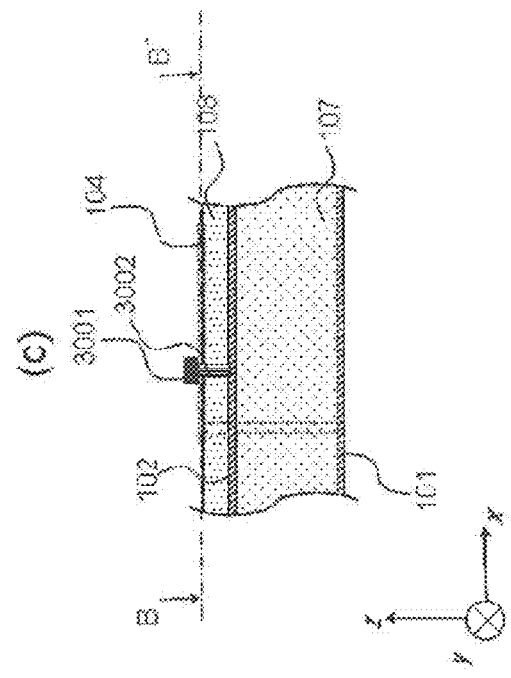
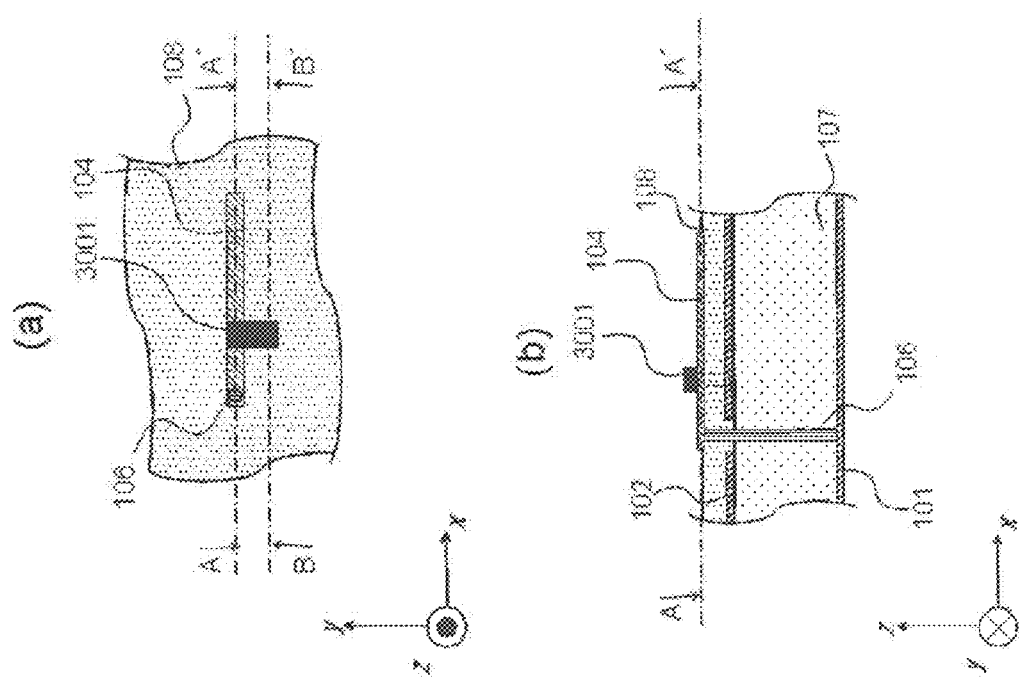

Fig.38
(a)
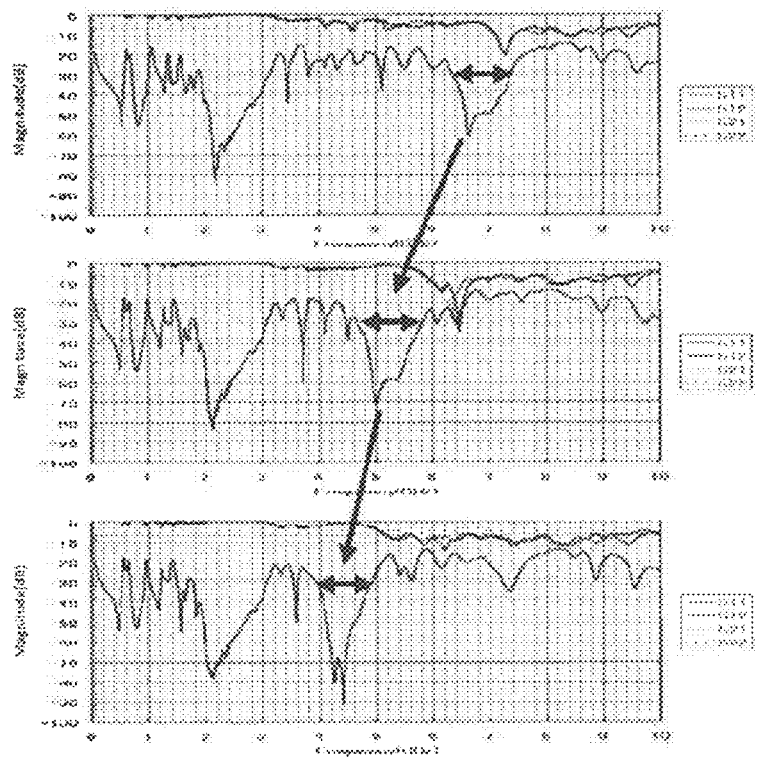
(b)
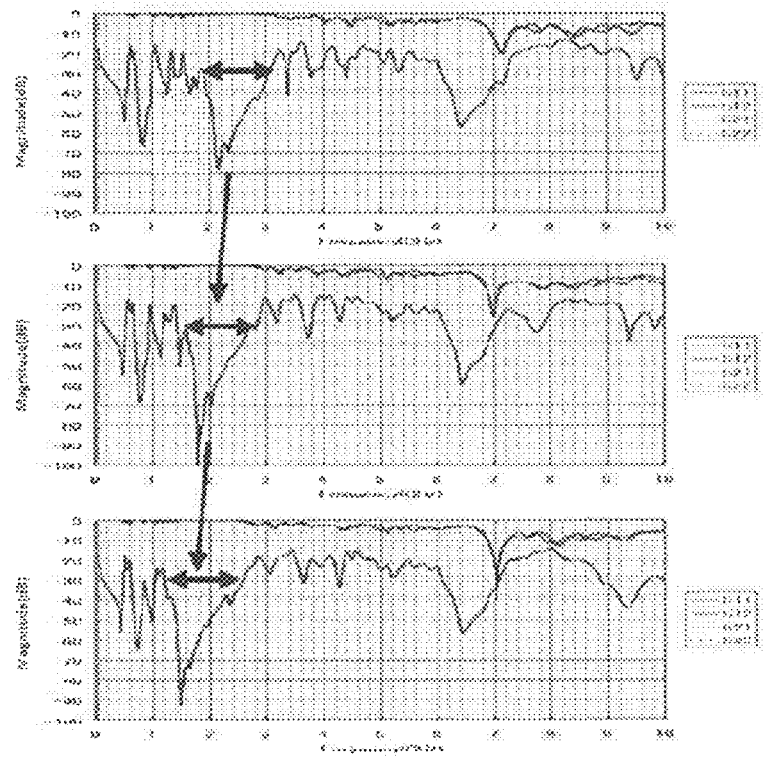

STRUCTURAL BODY AND WIRING BOARD

CROSS REFERENCE TO RELATED APPLICATIONS

This application is a National Stage of International Application No. PCT/JP2013/002111, filed on Mar. 28, 2013, which claims priority from Japanese Patent Application No. 2012-148869, filed on Jul. 2, 2012, the contents of all of which are incorporated herein by reference in their entirety.

TECHNICAL FIELD

The present invention relates to a structural body and a wiring board.

BACKGROUND ART

In an electric device that includes a plurality of conductor planes, electromagnetic waves are generated. Such electromagnetic waves are generated by a magnetic field induced by a current flowing into a digital circuit when the circuit is switched, or by an electric field induced by a voltage change that occurs when the circuit is switched. Such electromagnetic waves become electromagnetic noise that propagates in a parallel-plate transmission line formed of conductor planes. Such electromagnetic noise results in such problems as destabilized operation of other circuits and deteriorated performance of a wireless function of the device. In other words, establishment of a technique that suppresses electromagnetic noise allows stabilization of circuits and improvement in performance of a wireless function of the device.

Examples of methods that have been used to solve the above problems include: a method in which to insert a decoupling capacitor between conductor planes; and a method in which to avoid production of a large insular conductor plane. These methods, however, involve the following problems. In the method using a decoupling capacitor, unavoidable parasitic inductance of a capacitor makes it difficult to obtain a self-resonant frequency at a high frequency such as several hundred hertz. For this reason, the method using a decoupling capacitor can only be applied to frequencies up to about several hundred megahertz, and is not appropriate for high frequency ranges (for example, the 2.4-GHz range and the 5.2-GHz range), which have recently been used in wireless communication. The method in which to avoid production of a large insular conductor plane is based on the principle that the resonance frequency of conductor planes is shifted to a higher frequency by making conductor planes smaller. In practice, however, conductor planes having the same potential need to be connected in series to each other. For such connection, a connecting part between the insular conductor planes needs to be made thin. If the connecting part is made thin, the self inductance of that part increases, and consequently, a large voltage drop occurs at the time when a current flows when switching is performed. Thus, there is a practical limit in reducing conductor planes in size.

Examples of methods for solving the above problems include a method disclosed in Patent Document 1. Each of the structures disclosed in Patent Documents 1, 2, and 3 is a structure having the electromagnetic bandgap (EBG) property (hereinafter, referred to as the EBG structure), and is intended to suppress propagation of electromagnetic wave noise between power supply planes. The use of an EBG makes it possible to provide an electromagnetic-noise suppressing effect to the GHz ranges. Furthermore, unlike the method in which to provide conductor planes in the form of separate smaller islands, these methods involve no special processes on a power supply plane, and hence do not increase the self-inductance of the power supply plane.

CITATION LIST

Patent Literature

Patent Document 1: Specification of U.S. Pat. No. 7,215,007
Patent Document 2: Japanese Patent Application Publication No. 2010-199881
Patent Document 3: Japanese Patent Application Publication No. 2010-10183

SUMMARY OF INVENTION

Technical Problem

A wireless feature installed in a recent electric device corresponds to a plurality of frequency ranges in most cases. In an EBG, it is preferable that a plurality of bandgaps be controlled independently from one another.

The present invention is intended to make it possible to control a plurality of bandgaps independently from one another in an EBG.

Solution to Problem

Provided according to the present invention is a structural body including a first conductor, a second conductor, a first transmission line, a first conductor via, and a capacitance imparting member. The second conductor is formed in a layer different from a layer in which the first conductor is formed, and faces the first conductor. The first transmission line is formed in a layer different from the layers in which the first conductor and the second conductor are formed, and faces the second conductor, and one end thereof is an open end. The first conductor via connects the other end of the first transmission line and the first conductor to each other. The capacitance imparting member is connected to the first transmission line and forms capacitance between itself and the second conductor.

Further provided according to the present invention is a wiring board including a first conductor, a second conductor, a first transmission line, a first conductor via, and a capacitance imparting member. The second conductor is formed in a layer different from a layer in which the first conductor is formed, and faces the first conductor. The first transmission line is formed in a layer different from the layers in which the first conductor and the second conductor are formed, and faces the second conductor, and one end thereof is an open end. The first conductor via connects the other end of the first transmission line and the first conductor to each other. The capacitance imparting member is connected to the first transmission line and forms capacitance between itself and the second conductor.

Advantageous Effects of Invention

The present invention makes it possible to control a plurality of bandgaps independently from one another in an EBG.

BRIEF DESCRIPTION OF DRAWINGS

The above and other objects, and the features and advantages of the present invention will be better understood by reference to the following preferred embodiments and the accompanying drawings, wherein:

FIG. 6 illustrates views of examples of the unit structure of the EBG structure according to the first embodiment;

FIG. 26 illustrates are views of another example of the unit structure of the EBG structure according to the fourth embodiment;

FIG. 29 illustrates views of another example of the unit structure of the EBG structure according to the fourth embodiment;

FIG. 30 illustrates views of an example of the unit structure of the EBG structure according to a fifth embodiment;

FIG. 38 illustrates graphs of measurement results for the first embodiment.

DESCRIPTION OF EMBODIMENTS

The following describes embodiments according to the present invention with reference to the drawings. In all of the drawings, like reference signs are assigned to like components, and descriptions thereof are omitted as appropriate. In the following embodiments, a direction along the thickness of a board (the vertical direction in FIG. 1) is referred to as "the thickness direction".

First Embodiment

Figure 1:
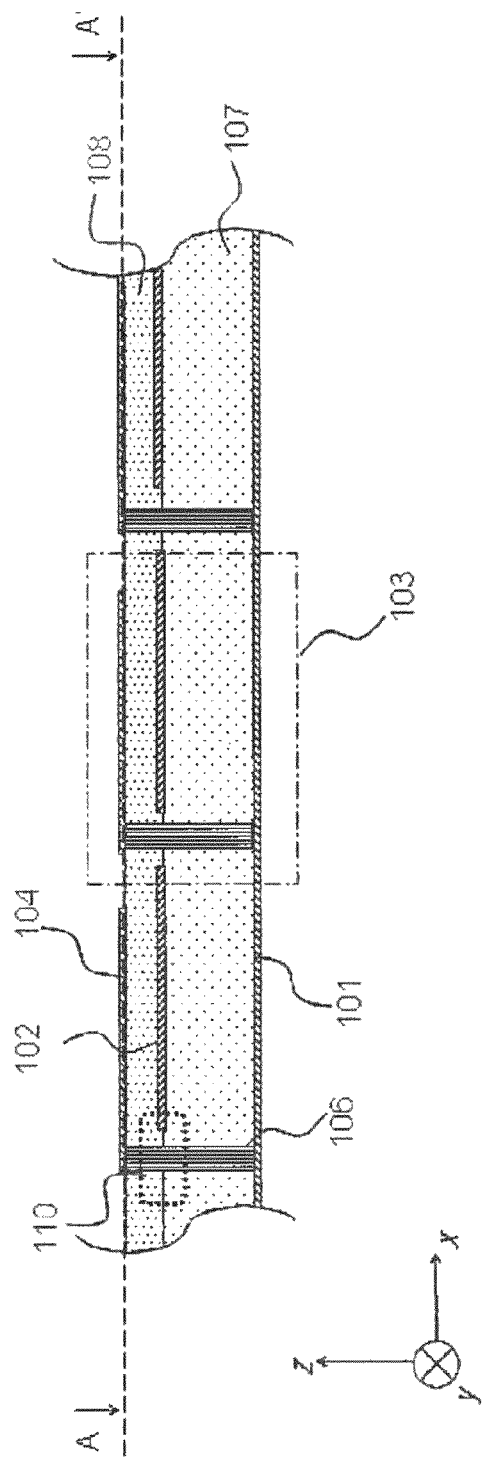
FIG. 1 is a view of an example of an EBG structure according to a first embodiment.
Figure 2:
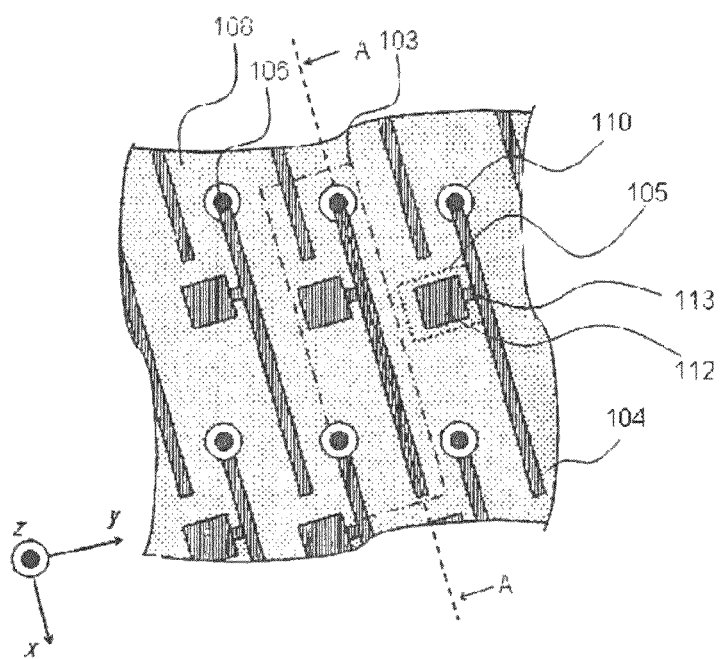
FIG. 2 is another view of the example of the EBG structure according to the first embodiment.

The configuration of a structural body according to a first embodiment is described with reference to FIG. 1 to FIG. 11 and FIG. 34 to FIG. 37. FIG. 1 is a cross-sectional view of the structural body according to this embodiment. FIG. 2 is a plan view of this embodiment. FIG. 1 is a cross-sectional view taken along line A-A' in FIG. 2. FIG. 2 is a cross-sectional view taken along line A-A' in FIG. 1.

As illustrated in FIG. 1 and FIG. 2, the structural body according to this embodiment includes a first conductor plane 101 (first conductor), a second conductor plane 102 (second conductor), first transmission lines 104, conductor vias 106 (first conductor vias), and insular conductors 112 (capacitance imparting members). The second conductor plane 102 is opposed to the first conductor plane 101. The first transmission lines 104 are formed in a layer different from those in which the first conductor plane 101 and the second conductor plane 102 are formed. The first transmission lines 104 face the second conductor plane 102, and one end of each thereof is an open end. Each of the conductor vias 106 connects the other end of the corresponding one of the first transmission lines 104 and the first conductor plane 101 to each other. Each of the insular conductors 112 is connected to the corresponding one of the first transmission lines 104 at a portion other than a portion thereof at which the first transmission line 104 is attached to the conductor via 106. The insular conductor 112 is located in a layer different from the one in which the second conductor plane 102 is located, and faces the second conductor plane 102. The structural body is described below in detail.

The structural body according to this embodiment is formed in a wiring board such as, for example, a printed-wiring board, and includes an electromagnetic bandgap (EBG) structure. This EBG structure includes the first conductor plane 101 and the second conductor plane 102, which are arranged parallel to and spaced from each other in the thickness direction, and unit structures 103, which are described later. Each of the unit structures 103 includes: the first transmission line 104 disposed in a layer different from those in which the first conductor plane 101 and the second conductor plane 102 are disposed; a structural body 105 that forms capacitance between the transmission line 104 and the second conductor plane 102; and the conductor via 106 that electrically connects the other end of the transmission line 104 and the first conductor plane 101 to each other. The structural body 105 that forms capacitance is formed in such a manner as to be connected to an intermediate portion of the transmission line 104, that is, a portion of the transmission line 104 other than both ends thereof. Here, the structural body 105 may be connected to a portion of the transmission line 104 other than a portion thereof at which the transmission line 104 is attached to the conductor via 106.

More specifically, the EBG structure includes a first dielectric layer 107 and a second dielectric layer 108 stacked on one side (the upper side) of the first dielectric layer 107 in the thickness direction. The first conductor plane 101 is disposed on the other side (the lower surface) of the first dielectric layer 107 in the thickness direction, and the second conductor plane 102 is disposed between the first dielectric layer 107 and the second dielectric layer 108. The conductor vias 106 each extend in the thickness direction and are provided in such a manner as to extend from one side (the upper surface) of the second dielectric layer 108 to the other side (the lower surface) of the first dielectric layer 107. The transmission lines 104 are each disposed on one side (the upper surface) of the second dielectric layer 108 in the thickness direction, and the structural body 105 is attached to an intermediate portion of the corresponding one of the transmission lines 104 so as to form capacitance between the transmission line 104 and the second conductor plane 102. In this embodiment, the structural body 105 that forms capacitance is formed of an insular conductor 112 arranged on the same plane as a plane on which the transmission line 104 is arranged, and a conductor connector 113 that connects the insular conductor 112 and the transmission line 104.

The transmission lines 104 are disposed on a plane that faces the second conductor plane 102, and are transmission lines for which the second conductor plane 102 serves as a return path. One end (the right end portion in FIG. 1) of each of the transmission lines 104 is an open end, and functions as an open stub. The other end (the left end portion in FIG. 1) of the transmission line 104 and the first conductor plane 101 are electrically connected to each other by the corresponding conductor via 106 extending in the thickness direction. The second conductor plane 102 has clearances 110 at positions corresponding to the conductor vias 106, and these clearances 110 electrically separate the conductor vias 106 from the second conductor plane 102, thereby producing a state where the conductor vias 106 are not making electrical contact with the second conductor plane 102.

The basic principle of operation of the EBG structure is described.

Figure 3:
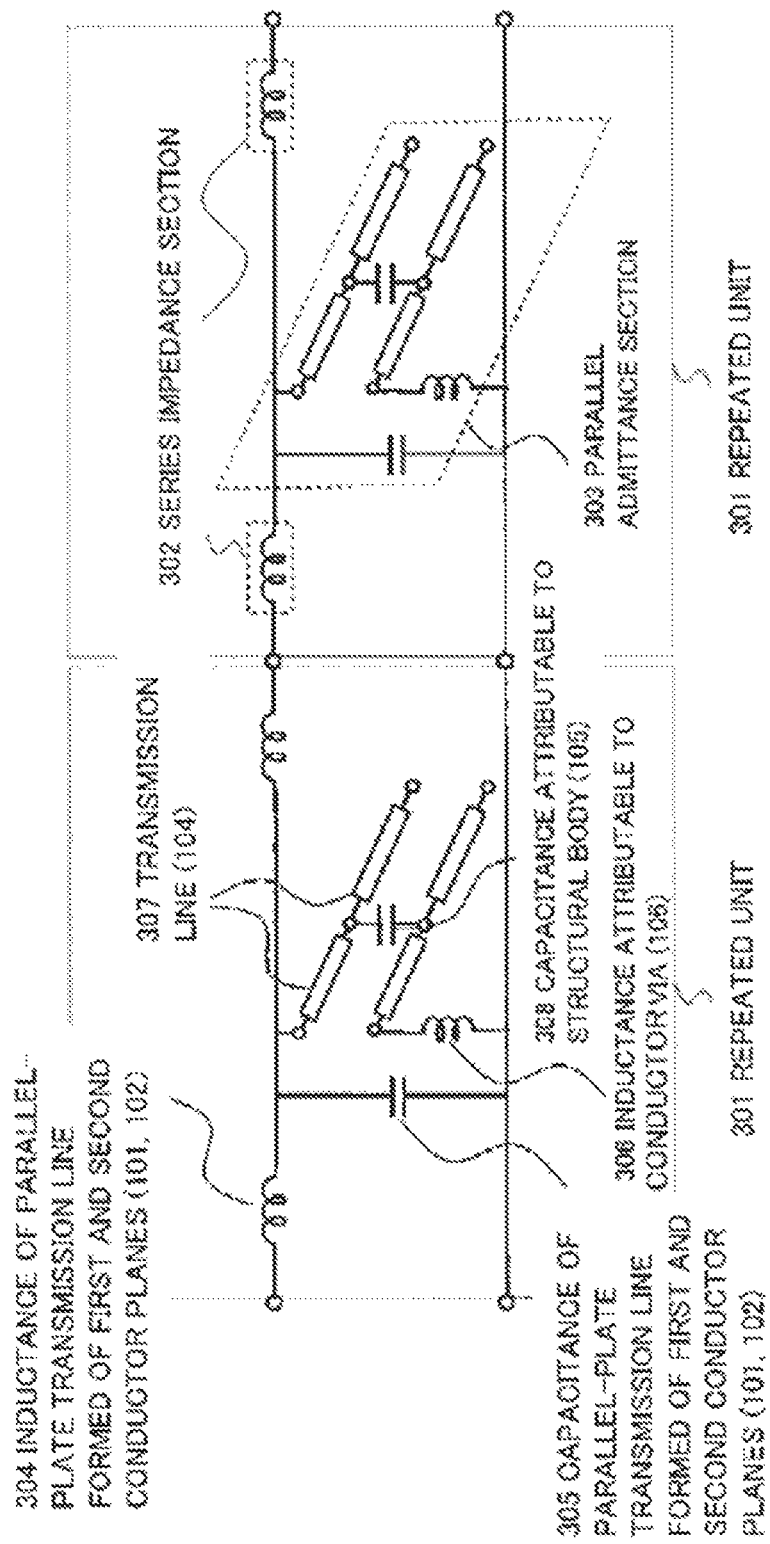
FIG. 3 is an equivalent circuit diagram of the EBG structure according to the first embodiment.
Figure 4:
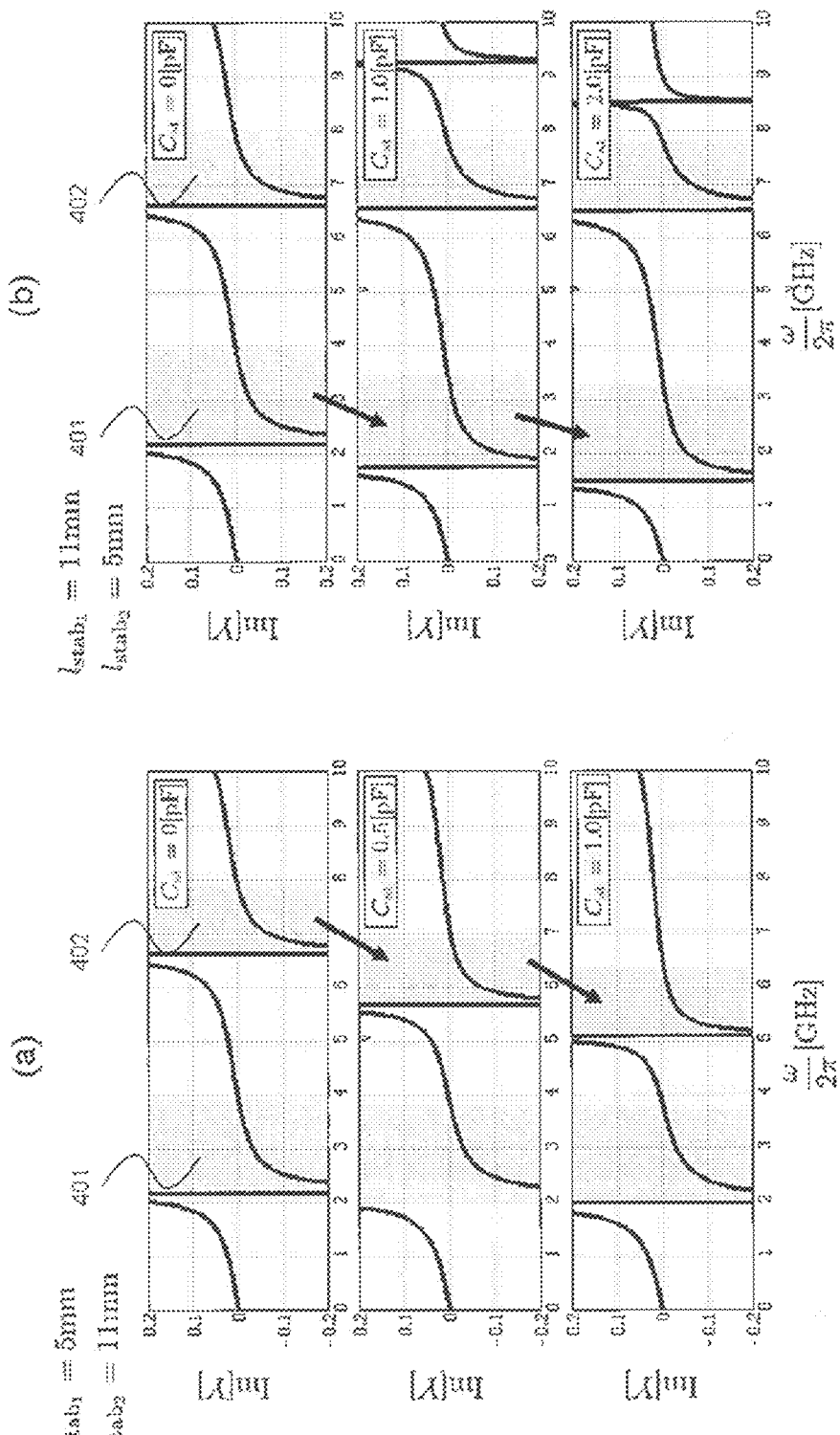
FIG. 4 illustrates graphs for explaining effects of the EBG structure according to the first embodiment.
Figure 5:
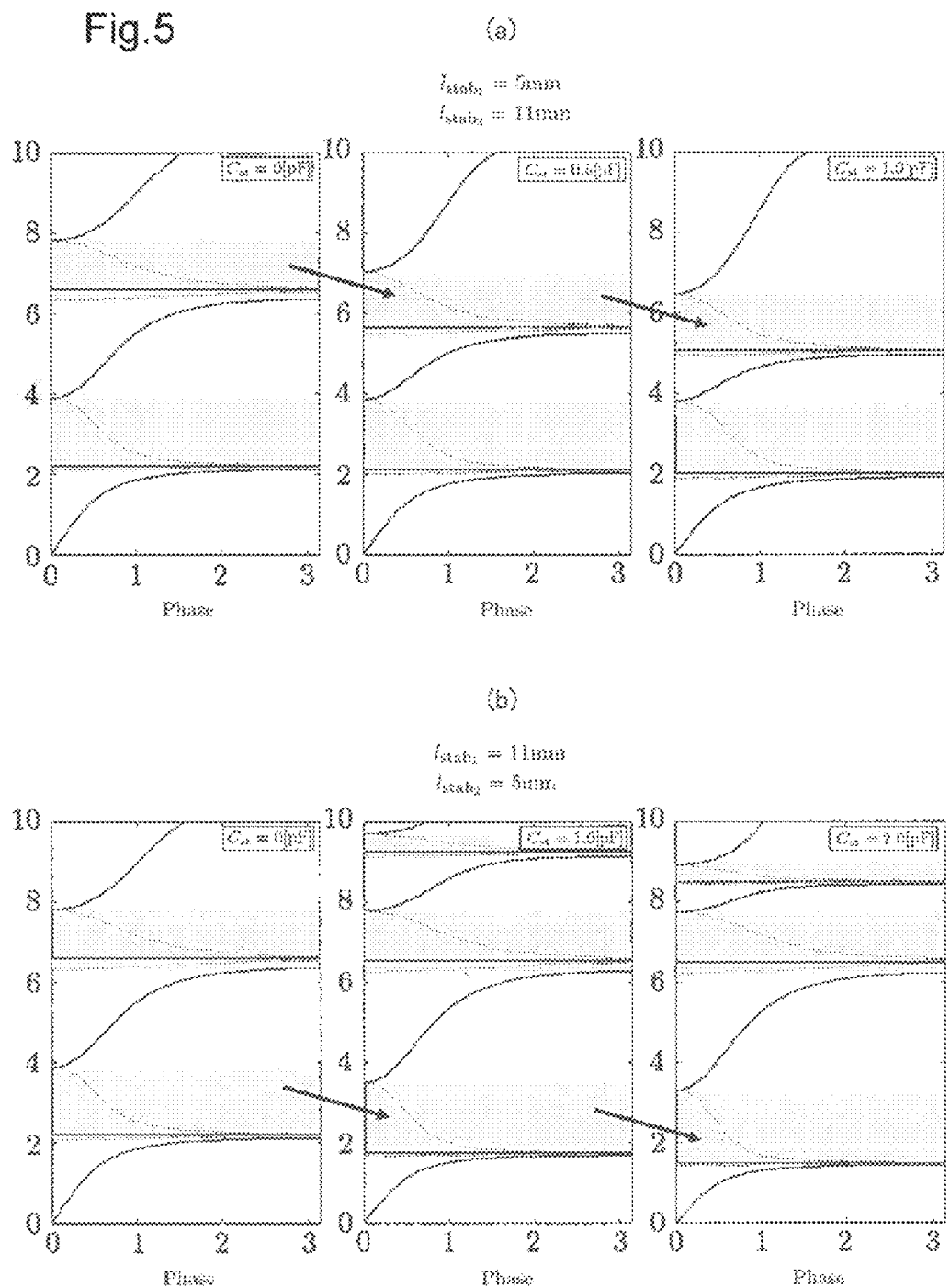
FIG. 5 illustrates graphs for explaining effects of the EBG structure according to the first embodiment.

FIG. 3 illustrates an equivalent circuit diagram in a direction along an arbitrary straight line on the x-y plane illustrated in FIG. 2 of the EBG structure according to the first embodiment. FIG. 4 illustrates graphs representing the frequency dependence of the imaginary part of an admittance of a parallel admittance section of this embodiment, and FIG. 5 represents distribution relations (relations between wave numbers and frequencies) in the EBG structure according to this embodiment.

As illustrated in FIG. 3, in the equivalent circuit according to this embodiment, a repeated unit 301 is composed of series impedance sections 302 and a parallel admittance section 30. Each of the series impedance sections 302 is composed of an inductance 304 of a parallel-plate transmission line formed of the first and the second conductor planes 101 and 102. The parallel admittance section 303 is composed of: a capacitance 305 of the parallel-plate transmission line formed of the first and the second conductor planes 101 and 102; an inductance 306 generated by the conductor via 106; and a capacitance 308 generated by a transmission line 307 (104) (an open stub) and the structural body 105, which is attached to an intermediate portion of the transmission line 307 (104). The equivalent circuit of the EBG structure of this embodiment is formed by connecting one or more repeated units 301 to one another in a row.

In the EBG structure according to this embodiment, a bandgap is generated in a frequency range in which the parallel admittance section 303 has the inductance property. The impedance of the series impedance section 302 and the admittance of the parallel admittance section 302 are represented by Expression (1) below.

[Mathematical Expression 1]

$$Z = j\omega L_{PPW} \qquad (1)$$
$$Y = \frac{1}{Z_{in} + j\omega L_{via}} j\omega C_{PPW},$$

where the symbols are defined as follows:
Z, series impedance;
Y, parallel admittance;
j, imaginary unit;
ω, angular frequency;
$L_{PPW}$, parallel-plate transmission line inductance;
$C_{PPW}$, parallel-plate transmission line capacitance;
$Z_{in}$, input impedance of a transmission line relative to its junction with a conductor via; and
$L_{via}$, inductance of the conductor via.

The input impedance of a transmission line 104 relative to a junction of the transmission line 104 and the conductor via 106 is represented by expression (2) below, in which capacitance generated by the structural body 105 that is put on the intermediate portion of a transmission line 307 (104) and forms capacitance is taken into consideration.

[Mathematical Expression 2]

$$Z_{in} = \frac{1 - \tan\beta l_{stab_1} \tan\beta l_{stab_2} + jZ_{stab_0} \tan\beta l_{stab_1} \cdot Y_{sh}}{jY_{stab_0}(\tan\beta l_{stab_1} + \tan\beta l_{stab_2}) + Y_{sh}} \qquad (2)$$

$$\beta = \omega\sqrt{\varepsilon_{eff}\varepsilon_0\mu_0},$$

where the symbols are defined as follows:

$Z_{stab0}$, characteristic impedance of a transmission line;

$Y_{stab0}$, characteristic admittance of the transmission line;

$Y_{sh}$, admittance of a structural body put on an intermediate portion of the transmission line;

β, phase constant of the transmission line;

$l_{stab1}$, length of the transmission line from its junction with a conductor via to the structural body;

$l_{stab2}$, length of the transmission line from the structural body to the open end;

$\in_{eff}$, effective relative permittivity of a medium relative to an electromagnetic wave that propagates through the transmission line;

$\in_0$, permittivity in vacuum; and $\mu_0$, magnetic permeability in vacuum.

The admittance of the structural body that is put on an intermediate portion of the transmission line and forms capacitance is represented by expression (3) provided below.

[Mathematical Expression 3]

$$Y_{sh} = j\omega C_{sh}, \qquad (3)$$

where $C_{sh}$ is the capacitance of the structural body put on the intermediate portion of the transmission line.

FIG. 4 represents the frequency dependence of the imaginary part of the admittance calculated by using the above expressions (1), (2), and (3). The parameters used in the calculation are as follows: the capacitance 305 of the parallel-plate transmission line is 0.47 pF; the inductance 306 due to the conductor via 106 is 0.17 nH; the characteristic impedance of the transmission line 307 is 40Ω; the entire length of the transmission line 307 (the sum of $l_{stab1}$ and $l_{stab2}$) is 16 mm; and the effective relative permittivity of the transmission line 307 is 4.2.

The three graphs in FIG. 4 (a) are graphs representing the frequency dependence of the admittance imaginary part under the following conditions: the length $l_{stab1}$ from the end of the transmission line on the side facing the conductor via 106 to the capacitance 308 formed by the structural body 105 is 5 mm; and corresponding capacitance formed by the structural bodies, each of which forms capacitance, are 0 pF, 0.5 pF, and 1.0 pF, respectively. As a result of the impedance transforming effect in the transmission line 307, the admittance cyclically transitions between periods when it has the capacitance property (Im(Y)>0) and when it has the inductance property (Im(Y)<0). In FIG. 4, Im(Y) is negative in frequency ranges 401 and 402, which are frequency ranges in which the inductance property is observed. Thus, bandgaps are expected to occur in these frequency ranges 401 and 402.

Here, the range 402, which is expected to be a second bandgap in FIG. 4 (a), is taken up for consideration. The graphs indicate that the range 402 expected to be the second bandgap shifts to lower frequencies with an increase in value of the capacitance 308 formed by the structural body. While the range 402 thus shifts, substantially no shift in frequency occurs to the frequency range 401 expected to be a first bandgap. It is therefore expected that the second bandgap can be selectively adjusted according to this structure. This is because the capacitance 308 formed by the structural body is arranged at a location where the amplitude of electric field is large in the second bandgap and is small in the first bandgap.

On the other hand, the three graphs in FIG. 4 (b) are graphs representing the frequency dependence of the admittance imaginary part under the following conditions: the length $l_{stab1}$ from the end of the transmission line on the side facing the conductor via 106 to the capacitance 308 formed by the structural body that forms capacitance is 11 mm; and corresponding capacitance formed by the structural bodies, each of which forms capacitance, are 0 pF, 1.0 pF, and 2.0 pF, respectively. These graphs indicate that only the first bandgap shifts to lower frequencies with an increase in value of the capacitance and that substantially no shift in frequency occurs to the second bandgap. This is because the capacitance 308 formed by the structural body is arranged at a location where, while the amplitude of an electric field is large in the first bandgap, the amplitude of an electric field is small in the second bandgap.

Although the parameters used as specific examples here are those that allow selective adjustment of the first bandgap and the second bandgap, selective adjustment of another bandgap is allowed by assigning a different value to the length $l_{stab1}$ from the end of the transmission line on the side facing the conductor via 106 to the capacitance 308 formed by the structural body 105.

In the EBG structure according to this embodiment, physical structures, each corresponding to the repeated unit 301 based on the above equivalent circuit, are cyclically arranged on grid points of a grid defined with constant grid spacing on an x-y plane. When this arrangement is taken into consideration, calculation of the bandgap range can be stricter. Calculation of a bandgap range reflecting the cyclic nature of the structure is made possible by imposing the cyclical boundary conditions on the repeated unit 301 of the equivalent circuit in FIG. 3.

FIG. 5 represents the distribution relation according to this embodiment with the grid spacing set to 2.71 mm. An equivalent circuit used in actual calculation is partially different from the equivalent circuit illustrated in FIG. 3. Specifically, an equivalent circuit described as a transmission line (parallel-plate transmission line) model regarding the inductance 304 of the parallel-plate transmission line formed by the first and the second conductor planes 101 and 102 and the capacitance 305 of the parallel-plate transmission line formed by the first and the second conductor planes 101 and 102 is used. Among the parameters used in the calculation, the characteristic impedance of the parallel-plate transmission line is 39.4Ω, and this value reflects the value 0.47 pF of the capacitance 305 of the parallel-plate transmission line used in the calculation for FIG. 4. The other parameters, which are the capacitance 305 of the parallel-plate transmission line, the inductance 306 attributable to the via, the characteristic impedance of the transmission line 307, the entire length (the sum of $l_{stab1}$ and $l_{stab2}$) of the transmission line 307, and the effective relative permittivity of the transmission line 307, take the same values as those used in the calculation for graphs in FIG. 4.

The three graphs in FIG. 5 (a) are graphs where parameters are set as follows: the length $l_{stab1}$ from the transmission line end on the side facing the conductor via to the capacitance 308 formed by the structural body is 5 mm; the values of the capacitance formed by the structural body are 0 pF, 0.5 pF, and 1.0 pF. These parameters are set to the same values as those used in the three graphs in FIG. 4 (a). The three graphs in FIG. 5 (b) are graphs where parameters are set as follows: the length $l_{stab1}$ from the transmission line end on the side facing the conductor via to the capacitance 308 formed by the structural body is 11 mm; the values of the capacitance formed by the structural body are 0 pF, 1.0 pF, and 2.0 pF. These parameters are set to the same values as those used in the three graphs in FIG. 4 (b).

The bandgap frequency ranges (shaded regions in the graphs) based on the strict calculation for FIG. 5 substantially coincide with the frequency ranges 401 and 402 in FIG. 4. This explains that the bandgap frequency ranges of the EBG structure according to this embodiment can be explained mostly on the basis of the frequency characteristics of the parallel admittance. Since the admittance of the parallel admittance section 303 is determined by Expressions (1), (2), and (3) provided above, appropriately designing the parameters in these expressions can result in creation of a bandgap range at a desired frequency range.

FIG. 38 represents actual measurement results for this embodiment. While FIG. 38 (a) illustrates the S parameters of the structure for which the first bandgap range was adjusted, FIG. 38 (b) illustrates the S parameters of the structure for which the second bandgap range was adjusted. A frequency range where the value of $S_{21}$ indicating a transmission characteristic among the S parameters shows a drop corresponds to a bandgap range. The following can be found from FIG. 38: the second bandgap range shifts with the frequency characteristics of the first bandgap range scarcely affected in FIG. 38 (a); and the first bandgap range shifts with the frequency characteristics of the second bandgap range scarcely affected in FIG. 38 (b). In other words, it can be found that this embodiment properly functions when it is applied to an actual board.

In the above-described first embodiment, the case where, as illustrated in FIG. 1, the structure is not present on the upper side of the plane on which the transmission lines 104 are disposed has been described. The structure may be present on the upper side of the plane on which the transmission lines 104 is disposed.

For example, as illustrated in FIG. 6 (a), another dielectric layer (a third dielectric layer 601) may be provided on the upper side of the plane on which the transmission line 104 is disposed. The provision of this third dielectric layer 601 can increase the effective relative permittivity of the transmission line 104. Expression (2) indicates that the frequency dependence of the impedance transforming effect owing to the transmission line 104 is more conspicuous as the effective relative permittivity of the transmission line 104 is larger. In other words, a bandgap can be provided at the same range even when a transmission line having a shorter length is used. Since the capacitance of the structural body 105 that forms the capacitance increases as the effective relative permittivity increases, a larger capacitance value can be obtained with the same structure as in the case where the third dielectric layer 601 is not provided, that is, the bandgap can be adjusted to be larger. Therefore, in order to miniaturize the EBG structure according to this embodiment, it is preferred that a dielectric material having a large relative permittivity be used as the additional third dielectric layer 601.

However, any dielectric material may be used in the case of further stacking a layer on the upper side not for the purpose of miniaturization of the EBG structure. Furthermore, a third conductor plane 602 may be present on the upper side of the third dielectric layer 601, for example, as illustrated in FIG. 6 (b). In this case, the third conductor plane shields the transmission line 104, whereby unwanted electromagnetic radiation from the transmission line 104 can be suppressed. Additionally, obviously, a dielectric layer or a conductor layer may be further stacked on the upper side or on the lower side.

Arrangement and shapes of the transmission lines 104 do not affect the above-described operations and effects as long as one end of each of the lines 104 is an open end and is connected to one of the conductor vias 106. The above-described embodiment illustrates the case where, as illustrated in FIG. 2, the transmission lines 104 are arranged with a certain angle formed between each of the transmission lines 104 and each of the x axis and the y axis, so as not to interfere with the surrounding clearances 110. However, it is obvious that the transmission lines 104 may be arranged in parallel with either of the axes so long as this arrangement does not result in interference with the clearances 110 or the like.

Figure 7:
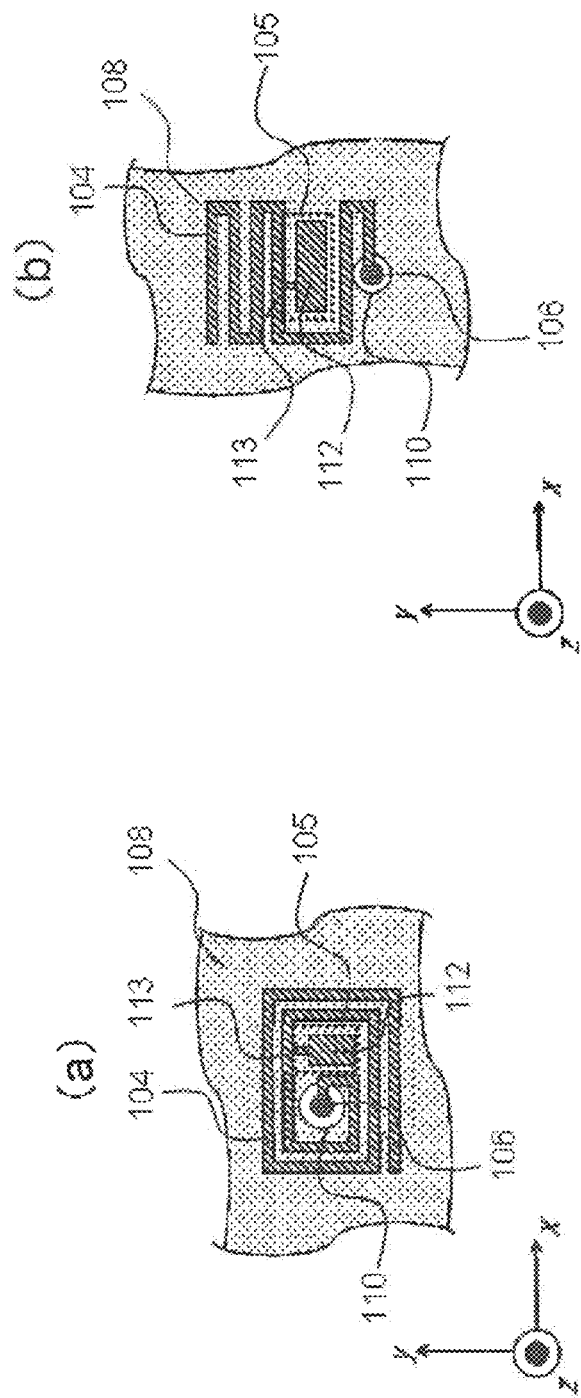
FIG. 7 illustrates views of examples of the unit structure of the EBG structure according to the first embodiment.

Furthermore, while the transmission line 104 has a linear shape as illustrated in FIG. 2 in this embodiment described above, the transmission line 104 may not necessarily have a linear shape, and may be formed in a spiral shape as illustrated in FIG. 7 (a) or in a meandering shape as illustrated in FIG. 7 (b). This case allows for a longer transmission line length in a small mounting area. Alternatively, the transmission line 104 may be formed in a totally irregularly extended shape. In this case, the transmission line 104 may be disposed in such a manner as to avoid other structural objects such as a transmission line of another unit structure.

Figure 8:
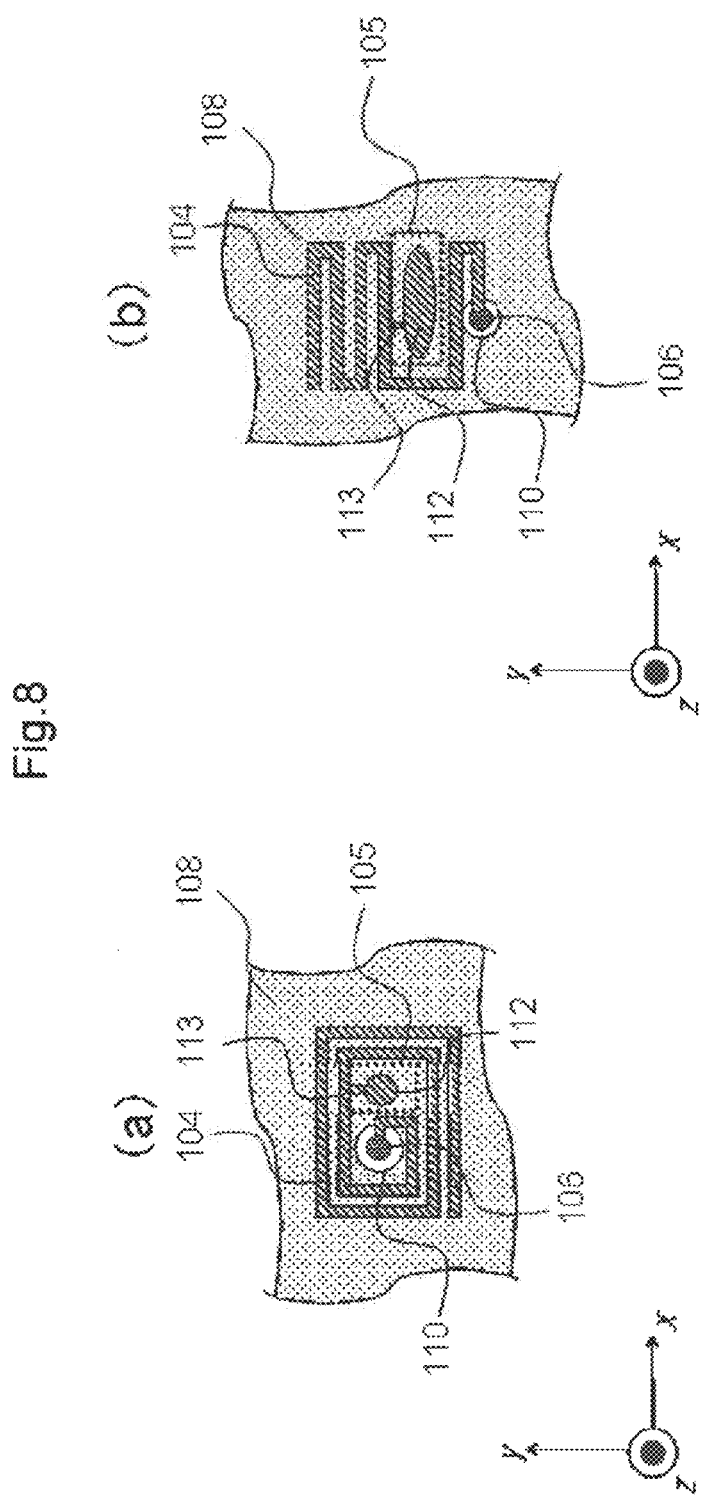
FIG. 8 illustrates views of examples of the unit structure of the EBG structure according to the first embodiment.

Furthermore, the above-described operations and effects are not affected by what shape the insular conductor 112 included in the structural body 105 that forms capacitance has. Although FIG. 2 illustrates the insular conductor 112 having a rectangular shape, the insular conductor 112 may have a circular shape or an oblong shape as illustrated in FIG. 8, or may have a totally different shape such as a polygonal shape.

Figure 9:
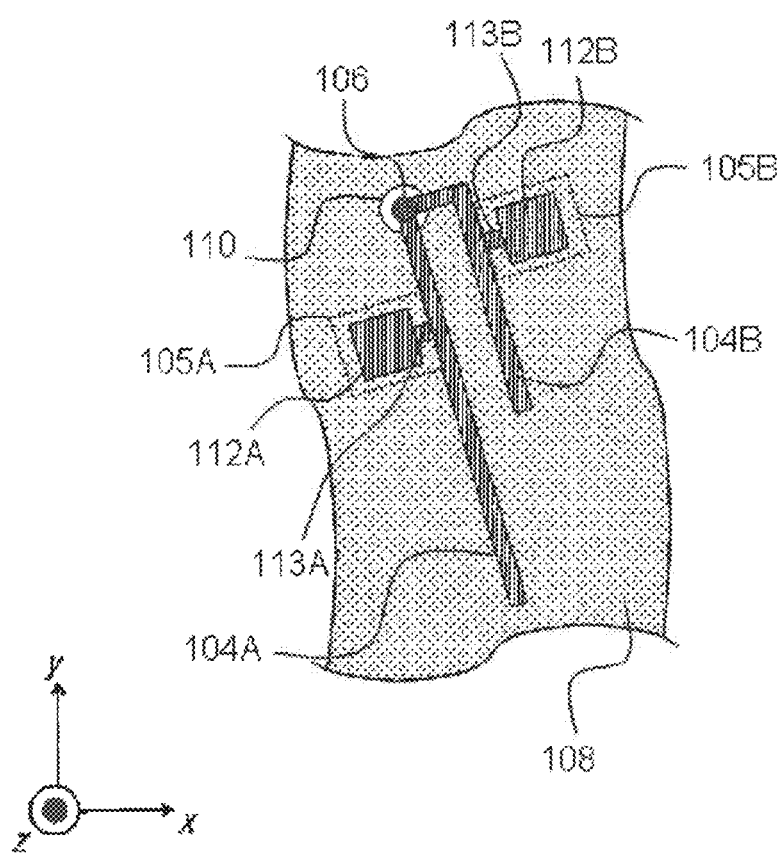
FIG. 9 is a view of another example of the unit structure of the EBG structure according to the first embodiment.

As illustrated in FIG. 9, another configuration where two transmission lines 104A and 104B having different lengths are attached to one of the conductor vias 106 can be conceived. While a structural body 105A that forms capacitance is attached to the transmission line 104A, a structural body 105B that forms capacitance is attached to the transmission line 104B. The transmission lines 104A and 104 B have different impedance transforming cycles, and two bandgap ranges are designed independently of each other. A specific bandgap of a plurality of bandgaps occurring at the transmission line 104A can be independently controlled by use of the structural body 105A attached to the transmission line 104A. A specific bandgap of a plurality of bandgaps occurring at the transmission line 104B can be controlled by use of the structural body 105B attached to the transmission line 104B.

Figure 10:
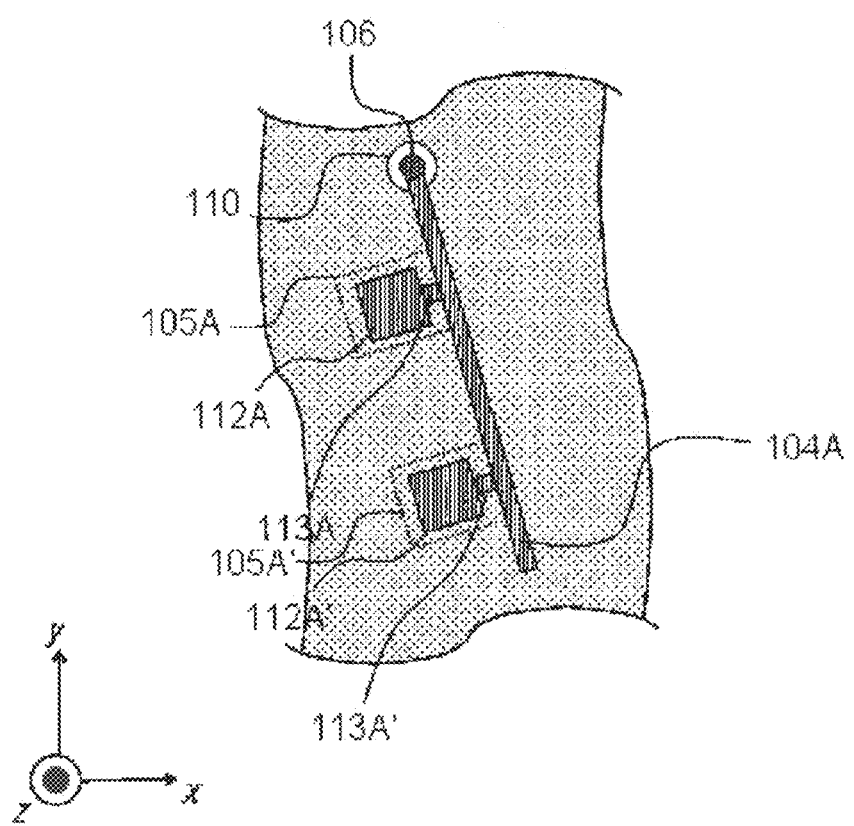
FIG. 10 is a view of another example of the unit structure of the EBG structure according to the first embodiment.

As illustrated in FIG. 10, another configuration in which a plurality of structural bodies that form capacitance are provided to one transmission line 104 can be conceived. In FIG. 10, a structural body 105A that forms first capacitance and another structural body 105A' that forms second capacitance are attached to an intermediate portion of the transmission line 104. With the structural bodies provided so as to act on different bandgaps, adjustment of a plurality of bandgaps is enabled through adjustment of positions at which these structural bodies are attached. When this adjustment is made, for adjustment of the n-th bandgap, the structural bodies that form capacitance are attached to the first transmission line at positions each located between positions $(2k-2)l_{os}/2n-l_{os}/4n$ away and $(2k-2)l_{os}/(2n-1)+l_{os}/4n$ (for k=1, 2, ..., n) away from the open end, where $l_{os}$ denotes the length of the transmission line 104. In these attachment positions, $(2k-2)l_{os}/2n-l_{os}/4n$ is negative when k=1, and therefore, $(2k-2)l_{os}/2n$ is used instead of $(2k-2)l_{os}/2n-l_{os}/4n$ only when k=1. Any one of the structural bodies may be attached to the transmission line 104 at or near the open end. When the structural bodies that form capacitance are attached to the transmission line 104 at positions each located between positions $(2k-2)l_{os}/2n-l_{os}/4n$ away and $(2k-2)l_{os}/(2n-1)+l_{os}/4n$ (for k=1, 2, ..., n) away from the open end, the structural bodies that form capacitance function to adjust the n-th bandgap range. The structural body that forms capacitance and is attached at or near the open end functions to adjust all of the bandgaps. Here, the positions each located between positions $(2k-2)l_{os}/2n$ away and $(2k-2)l_{os}/(2n-1)$ (for k=1, 2, ..., n) away from the open end, at which the structural bodies that form capacitance are attached to the first transmission line 104, explain locations at which the magnitude of electric field is maximum for the n-th bandgap. On the other hand, locations at which the magnitude of electric field is minimum for the k-th bandgaps are each between positions $(2k-1)l_{os}/(2n-1)$ away and $(2k-1)l_{os}/2n$ (for k=1, 2, ..., n) away from the open end. The structural bodies that form capacitance are attached at locations each corresponding not only to the minimum magnitude for the k-th bandgaps and but also to the maximum magnitude for the n-th bandgap range, whereby the n-th bandgap is selectively adjusted relative to the k-th bandgaps.

For example, the structural body 105A that forms the first capacitance is provided to the transmission line 104 at a position the distance of which from the open end is in a range from $l_{os}/16$ to $(l_{os}/3+l_{os}/4)$, more specifically, near a position the distance of which therefrom is $l_{os}/3$. The structural body 105A' that forms the second capacitance is provided to the transmission line 104 at a position the distance of which from the open end is in a range from $(l_{os}/2-l_{os}/8)$ to $(2l_{os}/3+l_{os}/8)$, more specifically, near a position the distance of which therefrom is $2l_{os}/3$. By being thus provided, the structural body 105A that forms the first capacitance operates to adjust the first bandgap, and the structural body 105A' that forms the second capacitance operates to adjust the second bandgap.

Figure 11:
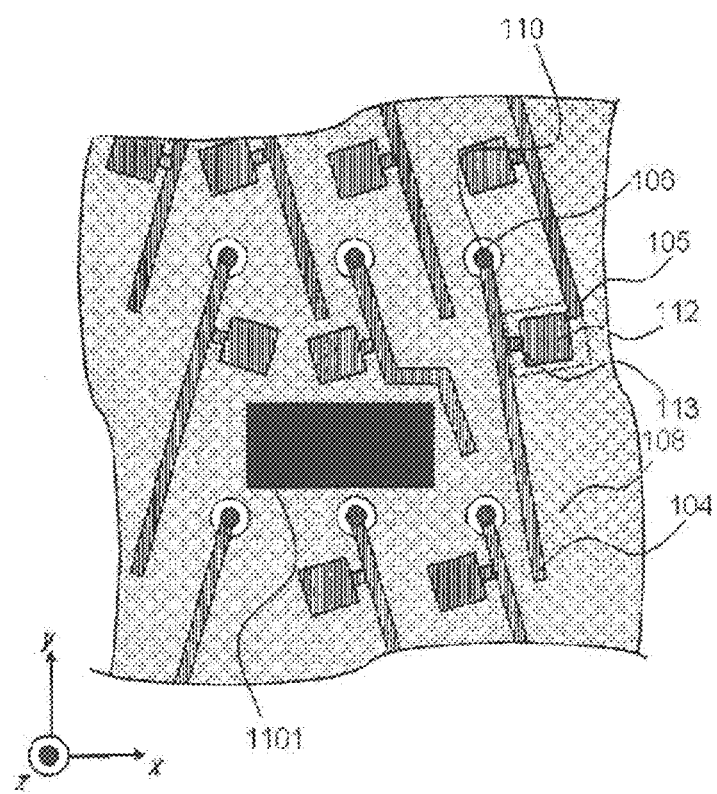
FIG. 11 is a view of another example of the EBG structure according to the first embodiment.

Regarding the arrangement and shapes of the transmission lines 104 and the structural bodies 105, the arrangement and shapes may not necessarily be uniform among unit structures as illustrated in FIG. 2. For example, it is possible to wire the transmission lines while avoiding a component 1101 mounted on a surface, as illustrated in FIG. 11. This wiring manner allows high-density mounting within a limited space.

Furthermore, this embodiment illustrates only cases where the structural body 105 that forms capacitance is composed of the insular conductor 112 and the conductor connector 113. Cases where the conductor connector 113 is present are illustrated merely for explanatory reasons, and this embodiment have the same effects in cases having the structural body 105 composed only of the insular conductor 112 without the conductor connector 113, that is, cases having the insular conductor 112 directly connected to the transmission line 104.

Figure 34:
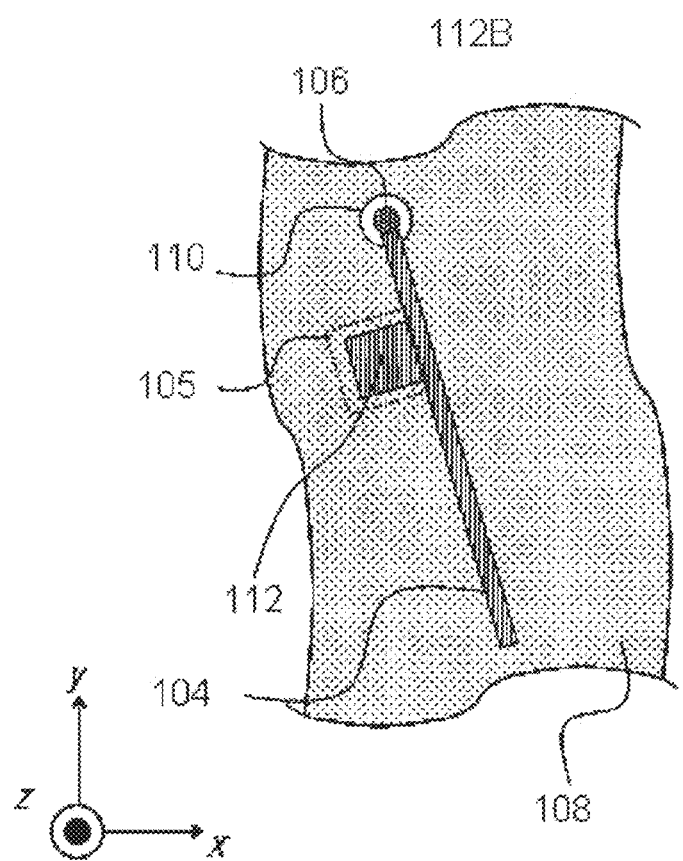
FIG. 34 is a view of another example of the unit structure of the EBG structure according to the first embodiment.
Figure 35:
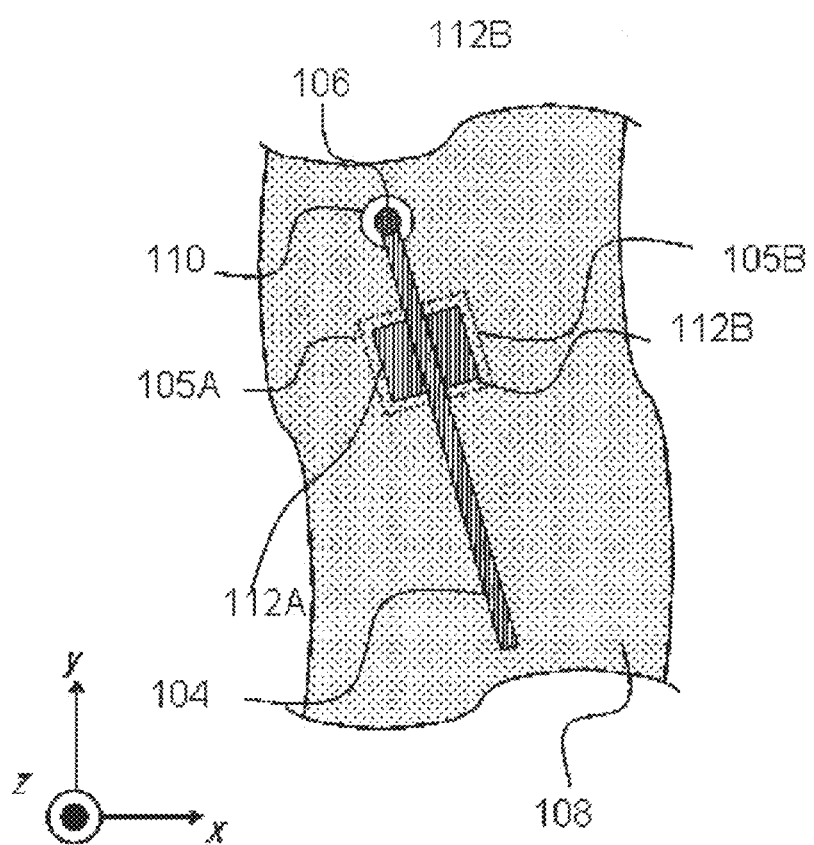
FIG. 35 is a view of another example of the unit structure of the EBG structure according to the first embodiment.
Figure 36:
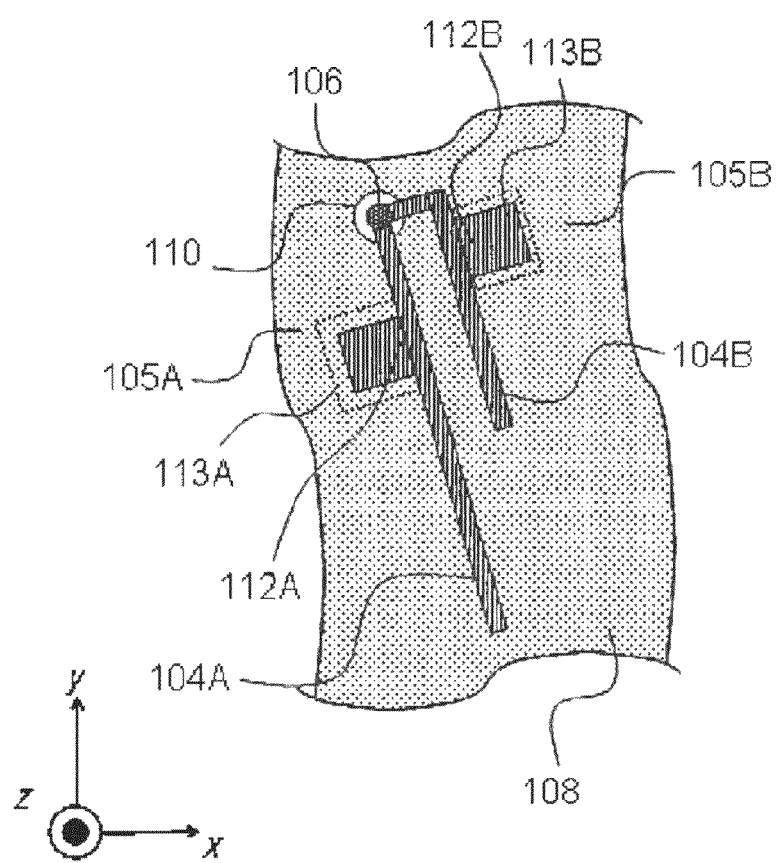
FIG. 36 is a view of another example of the unit structure of the EBG structure according to the first embodiment.
Figure 37:
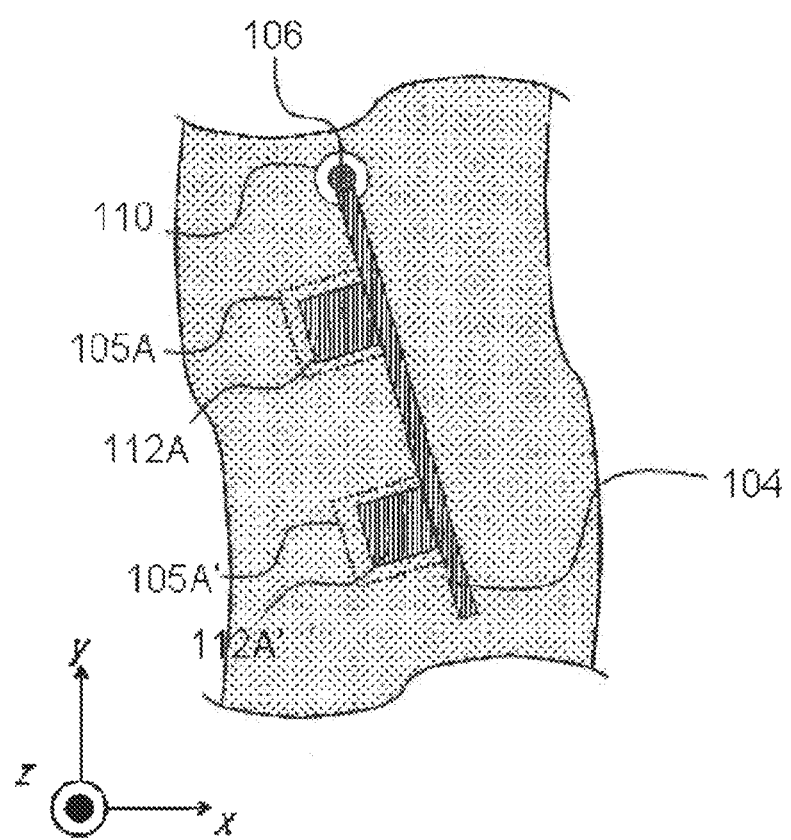
FIG. 37 is a view of another example of the unit structure of the EBG structure according to the first embodiment.

FIG. 34 illustrates a cross-sectional view of the unit structure according to such a configuration. According to such a configuration, this embodiment has the same effects as the other configurations described above. Furthermore, obviously, it is also possible to think of a configuration having the structural body 105 composed only of the insular conductor 112. For example, FIG. 35 illustrates an example in which the structural body 105A and the structural body 105B are attached to both sides of the transmission line 104. FIG. 36 illustrates an example in which the structural body 105 that forms capacitance is composed only of the insular conductor 112 in a configuration based on FIG. 9, and this example obviously has the same effects as those explained in the descriptions of FIG. 9. FIG. 37 illustrates an example in which the structural body 105 that forms capacitance is composed only of the insular conductor 112 in a configuration based on FIG. 10, and this example obviously has the same effects as those explained in the descriptions of FIG. 10.

Second Embodiment

Figure 12:
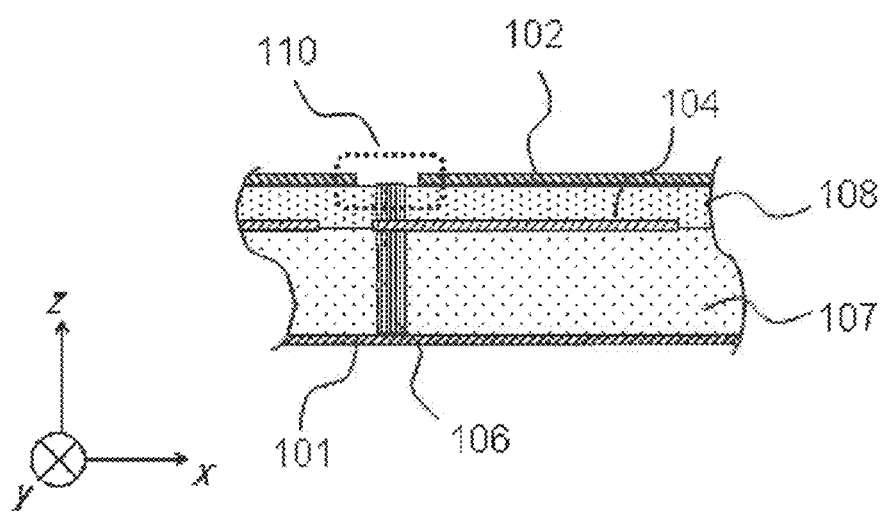
FIG. 12 is a view of an example of a unit structure of an EBG structure according to a second embodiment.
Figure 13:
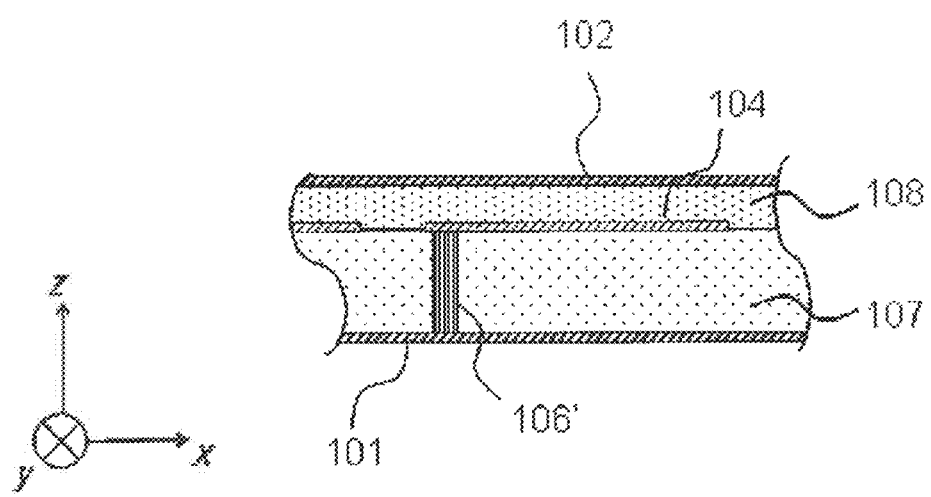
FIG. 13 is a view of another example of the unit structure of the EBG structure according to the second embodiment.

The following describes the configuration of a structural body according to a second embodiment with reference to FIG. 12 and FIG. 13. FIG. 12 and FIG. 13 are cross-sectional views of unit structures of an EBG structure according to this embodiment. The EBG structure according to this embodiment is a modification example of the EBG structure according to the above-described first embodiment. Therefore, the same reference signs are assigned to the same components as those in the first embodiment, and descriptions thereof are omitted.

The EBG structure in this embodiment differs from that in the first embodiment in that, as illustrated in FIG. 12, the transmission line 104 is provided inside a region sandwiched between the first conductor plane 101 and the second conductor plane 102 in the thickness direction. More specifically, in the EBG structure in this embodiment, while the second conductor plane 102 is disposed on one side (the upper side) of the second dielectric layer 108 in the thickness direction, the first conductor plane 101 is disposed on the other side (lower side) of the first dielectric layer 107 in the thickness direction. In an intermediate layer sandwiched between the first dielectric layer 107 and the second dielectric layer 108, the transmission lines 104 for which the second conductor plane 102 serves as a return path are arranged. One end of the transmission lines 104 in this embodiment is an open end as in the case of the transmission line 104 in first embodiment, and functions as an open stub. The other end of the transmission line 104 is electrically connected to the first conductor plane 101 through the conductor via 106. Furthermore, the structural body 105 that forms capacitance is provided to an intermediate portion of the transmission line 104 so as to form capacitance between the transmission line 104 and the second conductor plane 102.

In this embodiment, the structural body 105 that forms capacitance is composed of an insular conductor 112 arranged on the same plane as a plane on which the transmission line 104 is arranged, and a conductor connector 113 that connects the insular conductor 112 and the transmission line 104 to each other. In the similar manner as in the first embodiment described above, the transmission line 104, the structural body 105 that forms capacitance, and the conductor via 106 function as a parallel shunt section. The conductor via 106 and the second conductor plane 102 are electrically separated from each other by the clearances 110 provided in the second conductor plane 102, thereby being built into a structure allowing no electrical contacts therebetween. In this embodiment, the arrangement of the unit structures 103, the arrangement and shapes of the transmission lines 104, locations at which the structural bodies 105 that form capacitance are attached to the transmission lines 104, and the shapes of the structural bodies 105 are the same as described in the first embodiment.

In the EBG structure in this embodiment, the transmission line 104 and the structural body 105 that form capacitance are shielded by the two conductor planes 101 and 102, whereby unwanted electromagnetic waves can be prevented from externally radiating either from the transmission line 104 or the structural body 105 that forms capacitance.

In this embodiment described heretofore, the conductor via 106 is configured as a penetrating via as illustrated in FIG. 12. However, the conductor via 106 may not necessarily be a penetrating via so long as the conductor via 106 and the first conductor plane 101 are electrically connected. For example, providing a conductor via 106' present as a non-penetrating via as illustrated in FIG. 13 does not affect the effects of this embodiment at all.

The EBG structure illustrated in FIG. 13 does not necessitate the clearances 110 in the second conductor plane 102, and can thereby keep electromagnetic waves from radiating to the outside from the clearances 110.

Third Embodiment

The following describes configurations of a structural body according to a third embodiment with reference to FIG. 14 to FIG. 19. This embodiment is a modification example of the first embodiment, and descriptions of the same components as those in the first embodiment are omitted. This embodiment differs from the first embodiment in the manner in which the structural body 105 that forms capacitance is mounted.

Figure 14:
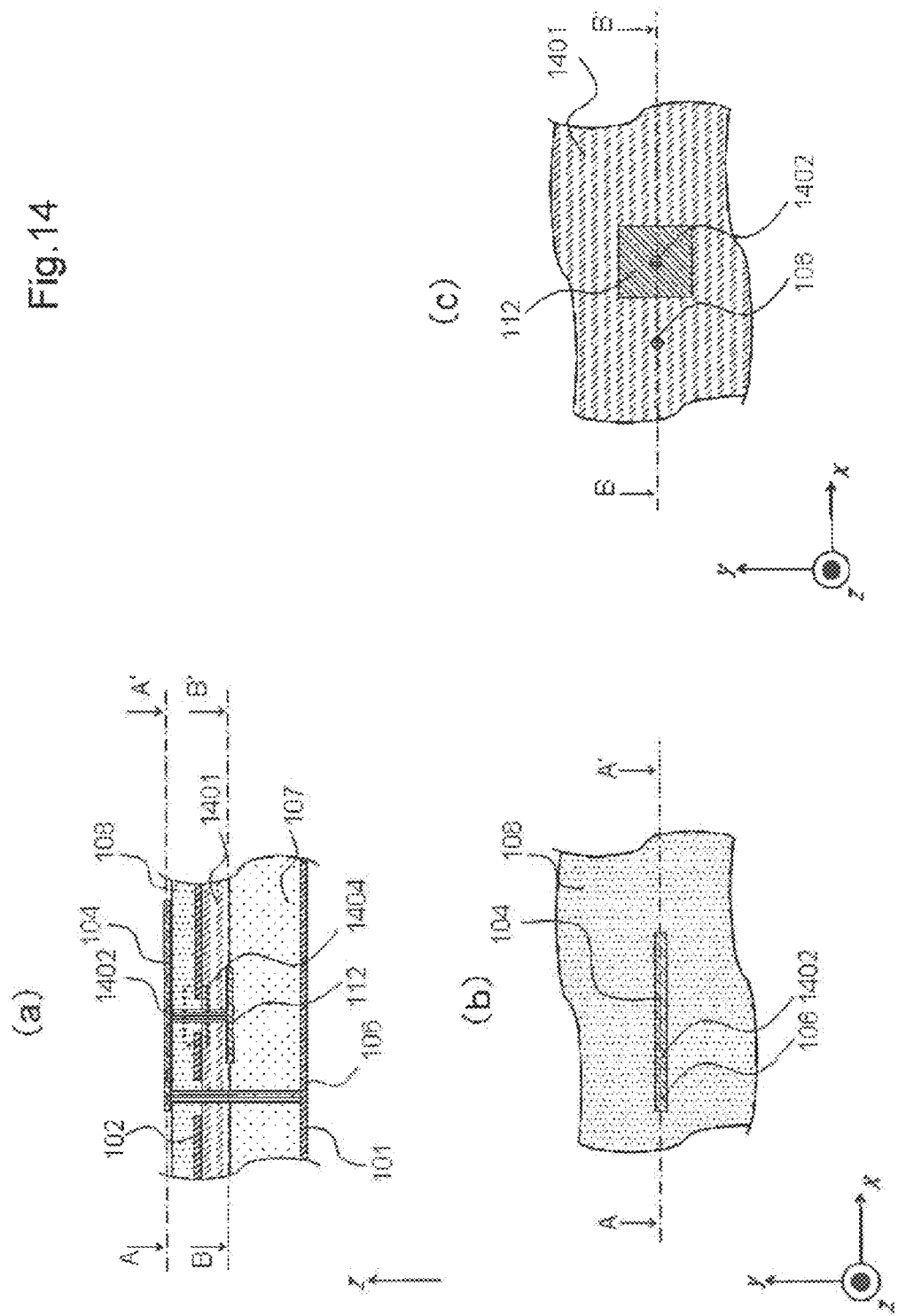
FIG. 14 illustrates views of an example of the unit structure of the EBG structure according to a third embodiment.
Figure 15:
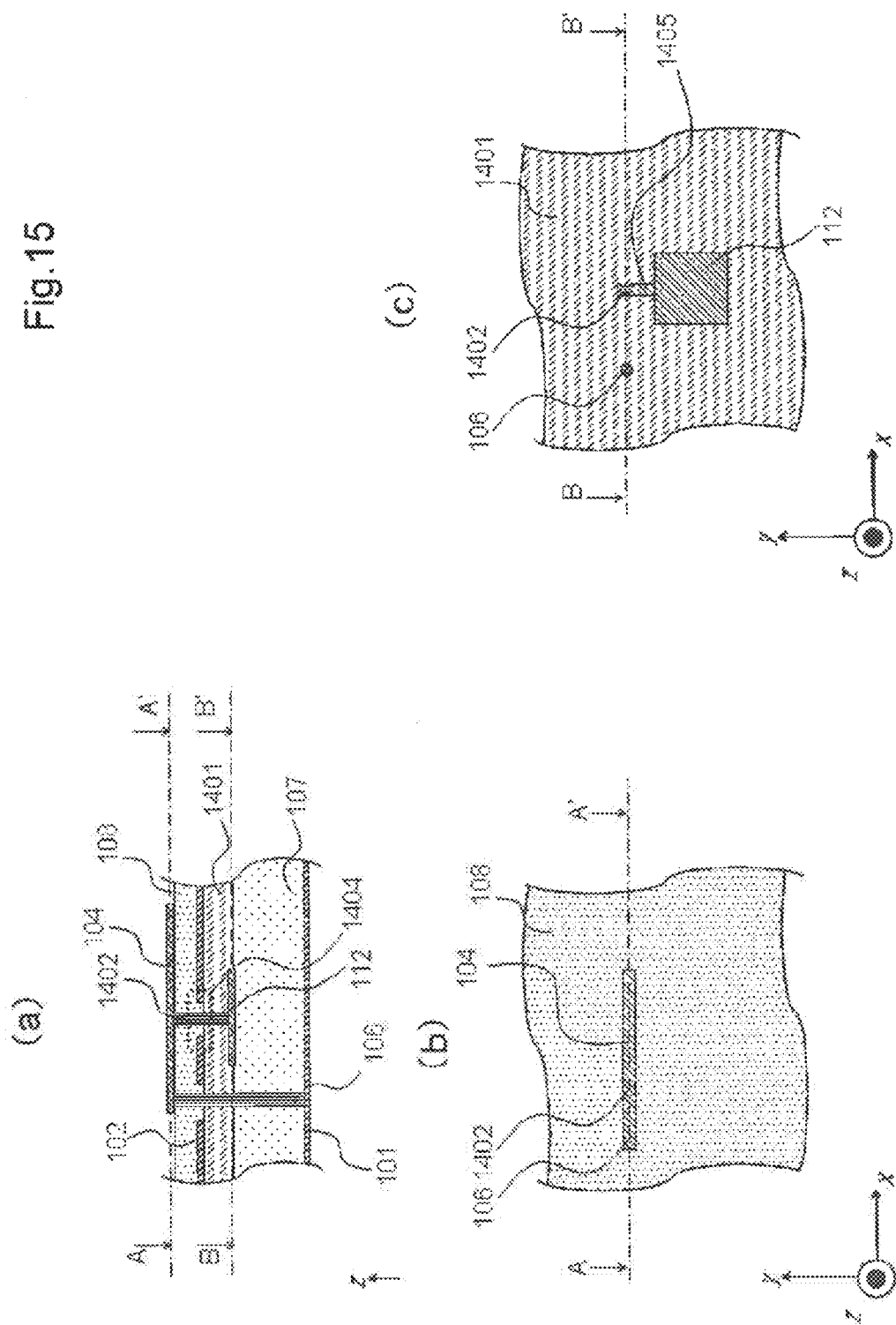
FIG. 15 illustrates views of another example of the unit structure of the EBG structure according to the third embodiment.

FIG. 14 and FIG. 15 illustrate cross-sectional views of unit structures of the EBG structure according to this embodiment. FIG. 14 (*a*) is a cross-sectional view taken along line A-A' in FIG. 14 (*b*) and also is a cross-sectional view taken along line B-B' in FIG. 14 (*c*); FIG. 14 (*b*) is a cross-sectional view taken along line A-A' in FIG. 14 (*a*); and FIG. 14 (*c*) is a cross-sectional view taken along line B-B' in FIG. 14 (*a*). FIG. 15 (*a*) is a cross-sectional view taken along line A-A' in FIG. 15 (*b*) and also is a cross-sectional view taken along line B-B' in FIG. 15 (*c*); FIG. 15 (*b*) is a cross-sectional view taken along line A-A' in FIG. 15 (*a*); and FIG. 15 (*c*) is a cross-sectional view taken along line B-B' in FIG. 15 (*a*). As illustrated in FIG. 14 (*a*) and FIG. 15 (*a*), the EBG structure in this embodiment differs from those in the first embodiment and the second embodiment in that the structural body 105 that forms capacitance is provided by use of a layer different from a layer in which the transmission line 104 is provided.

To begin with, it is assumed that in the EBG structure according to this embodiment, the transmission line 104 is disposed on the upper side of the second dielectric layer 108 in accordance with the first embodiment. More specifically, a fourth dielectric layer 1401 is additionally provided between the first dielectric layer 107 and the second dielectric layer 108, and the structural body 105 that forms capacitance is provided by use of one side of the fourth dielectric layer (the lower side in the example of FIG. 14). In this case, the second conductor plane 102 is provided on the upper surface of the fourth dielectric layer 1401.

In this embodiment, the structural body 105 that forms capacitance is composed of a conductor via 1402 and an insular conductor 112 (FIG. 14) or of a conductor via 1402, a conductor section 1405, and an insular conductor 112 (FIG. 15).

FIG. 14 illustrates one example composed of the conductor via 1402 and the insular conductor 112. The insular conductor 112 is provided on the lower side of the fourth dielectric layer 1401, and is electrically connected to a transmission line through the conductor via 1402 extending in the thickness direction from the lower surface of the fourth dielectric layer 1401 to the upper surface of the second dielectric layer 108. In this case, a clearance 1404 is provided in the second conductor plane at a position corresponding to conductor via 1402 so that the conductor via 1402 and the second conductor plane 102 can be electrically separated from each other. In FIG. 14, the insular conductor 112 and the transmission line 104 overlap each other in a top view, and therefore are connected to each other only by the conductor via 1402. In an arrangement in which the insular conductor 112 and the transmission line 104 do not overlap each other in a top view, the conductor section 1405 for extending the insular conductor 112 to a position overlapping the transmission line 104 in a top view as illustrated in FIG. 15 is provided, so that the insular conductor 112 and the transmission line 104 can be connected to each other by the conductor section 1405 and the conductor via 1402. In FIG. 15, the insular conductor 112 is extended with the conductor section 1405 by use of a plane on which the insular conductor 112 is arranged. However, the transmission line 104 and the insular conductor 112 may be electrically connected to each other through the conductor section 1405 and the conductor via 1402 by use of a plane on which the transmission line 104 is disposed, by extending the transmission line 104 with the conductor section 1405. The insular conductor 112 faces the second conductor plane 102, and forms capacitance between the insular conductor 112 and the second conductor plane 102.

As in the case of the first embodiment described above, the transmission line 104, the structural body 105 that forms capacitance, and the conductor via 106 function as a parallel admittance section. In this embodiment, the arrangement of the unit structures 103, the arrangement and shapes of transmission lines 104, the locations at which the insular conductors 112 constituting the structural bodies 105 that form capacitance are attached to the transmission lines 104, and the shapes of the insular conductors 112 are the same as described in the first embodiment.

In the EBG structure in this embodiment, the insular conductor 112 included in the structural body 105 that forms capacitance is arranged in a layer different from a layer in which the transmission line 104 is arranged. This arrangement makes it possible to reduce a mounting space in a top view while maintaining equivalent effects, as compared to the arrangement of the insular conductor 112 in the same layer as a layer in which the transmission line 104 is arranged.

Figure 16:
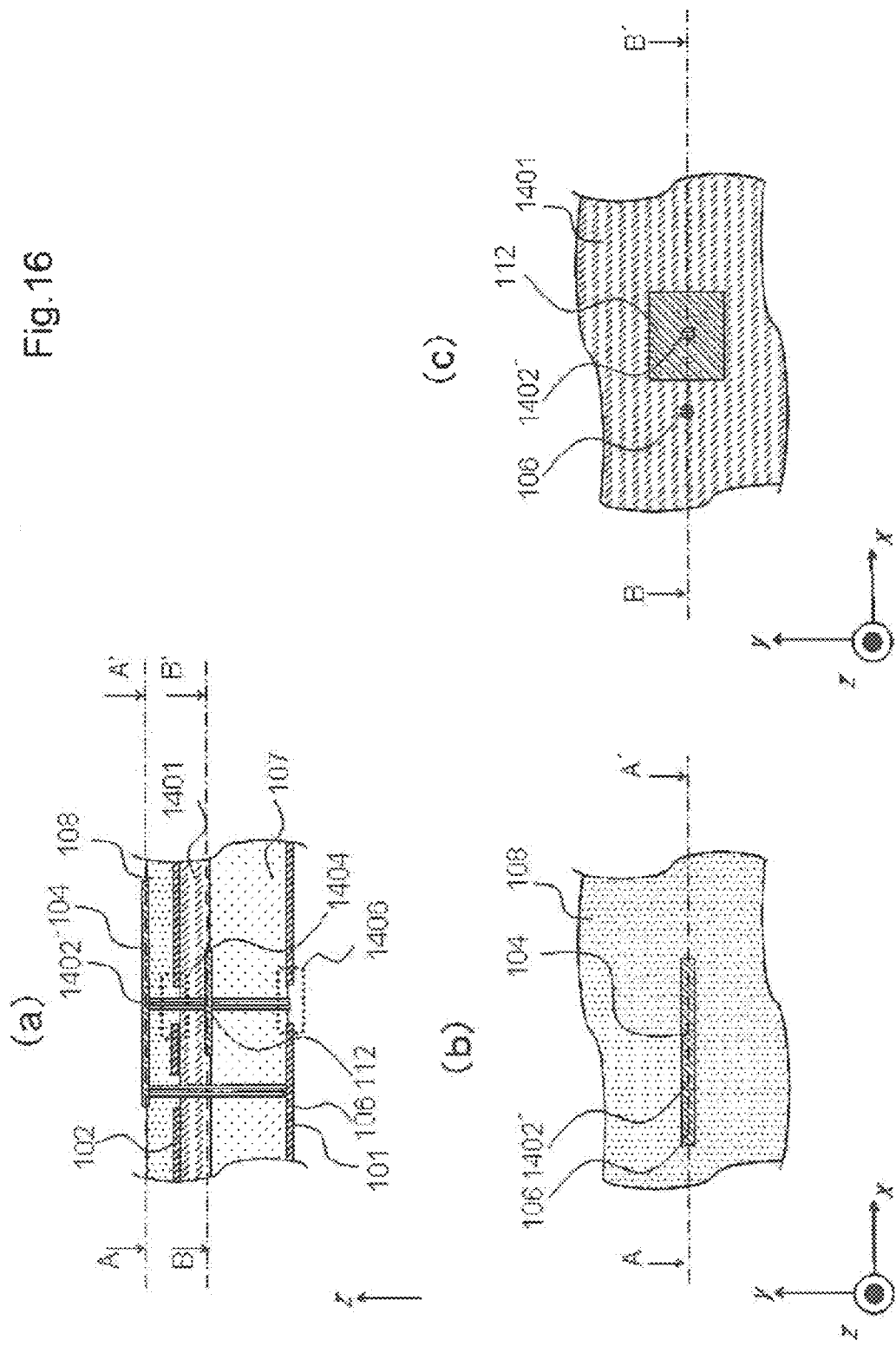
FIG. 16 illustrates views of another example of the unit structure of the EBG structure according to the third embodiment.

In this embodiment described heretofore, the conductor via 1402 is present as a non-penetrating via as illustrated in FIG. 14 and FIG. 15. However, the conductor via 1402 may not necessarily be a non-penetrating via, as long as the conductor via 1402 electrically connects the second conductor plane 102 and the insular conductor 112 (or the conductor section 1405). For example, as illustrated in FIG. 16, a penetrating conductor via 1402' may be provided in place of the conductor via 1402, and this change does not affect the effects of this embodiment at all. In providing the conductor via 1402', it is necessary to provide a clearance 1406 in the first conductor plane 101 at a position corresponding to the conductor via 1402' in order to avoid an electrical contact between the conductor via 1402' and the first conductor plane.

While the configuration based on the first embodiment has been described heretofore, it is obviously possible to base this embodiment on the second embodiment and configure it to have the transmission line 104 provided between the first conductor plane 101 and the second conductor plane 102.

Figure 17:
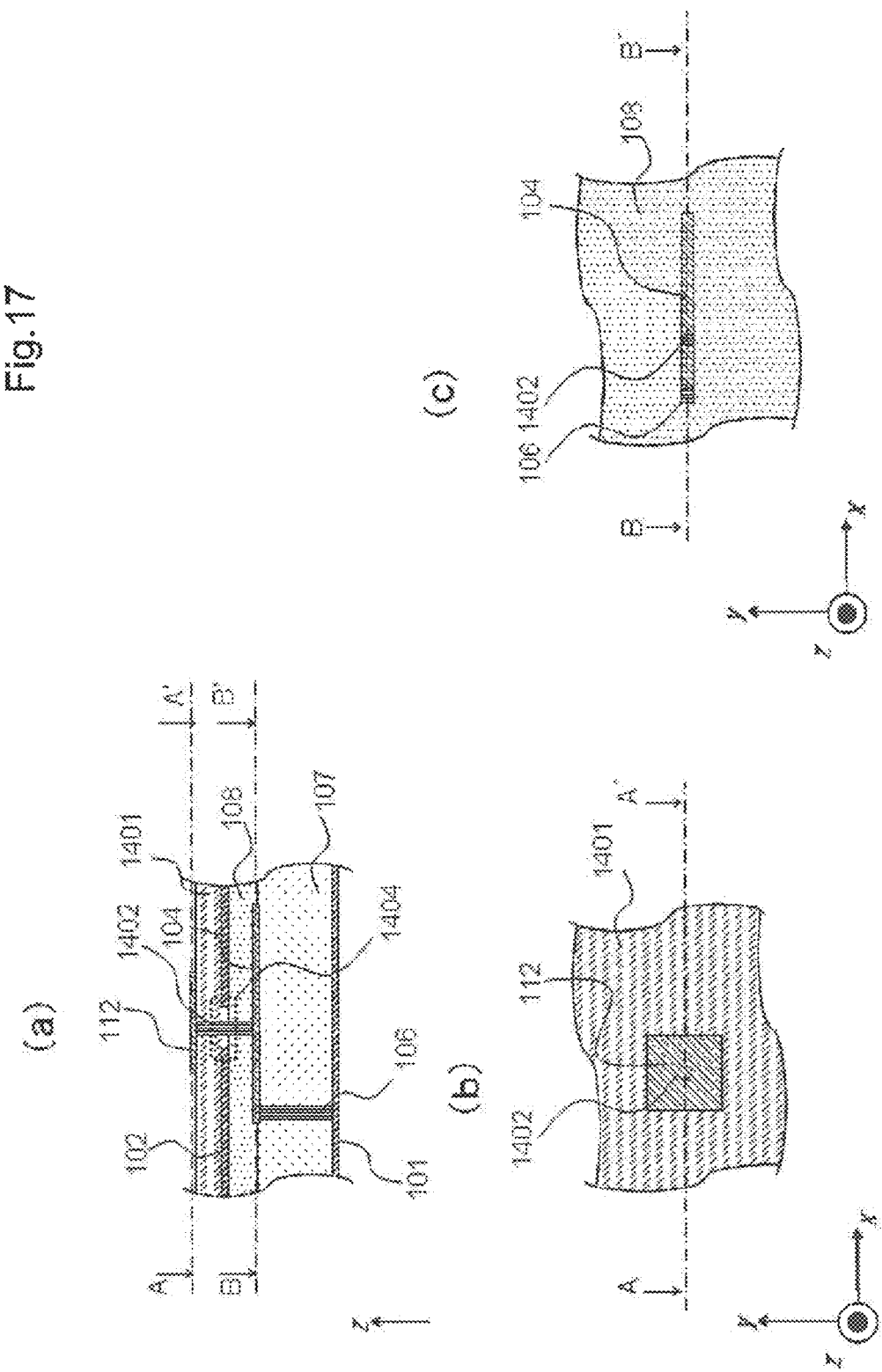
FIG. 17 illustrates views of another example of the unit structure of the EBG structure according to the third embodiment.
Figure 18:
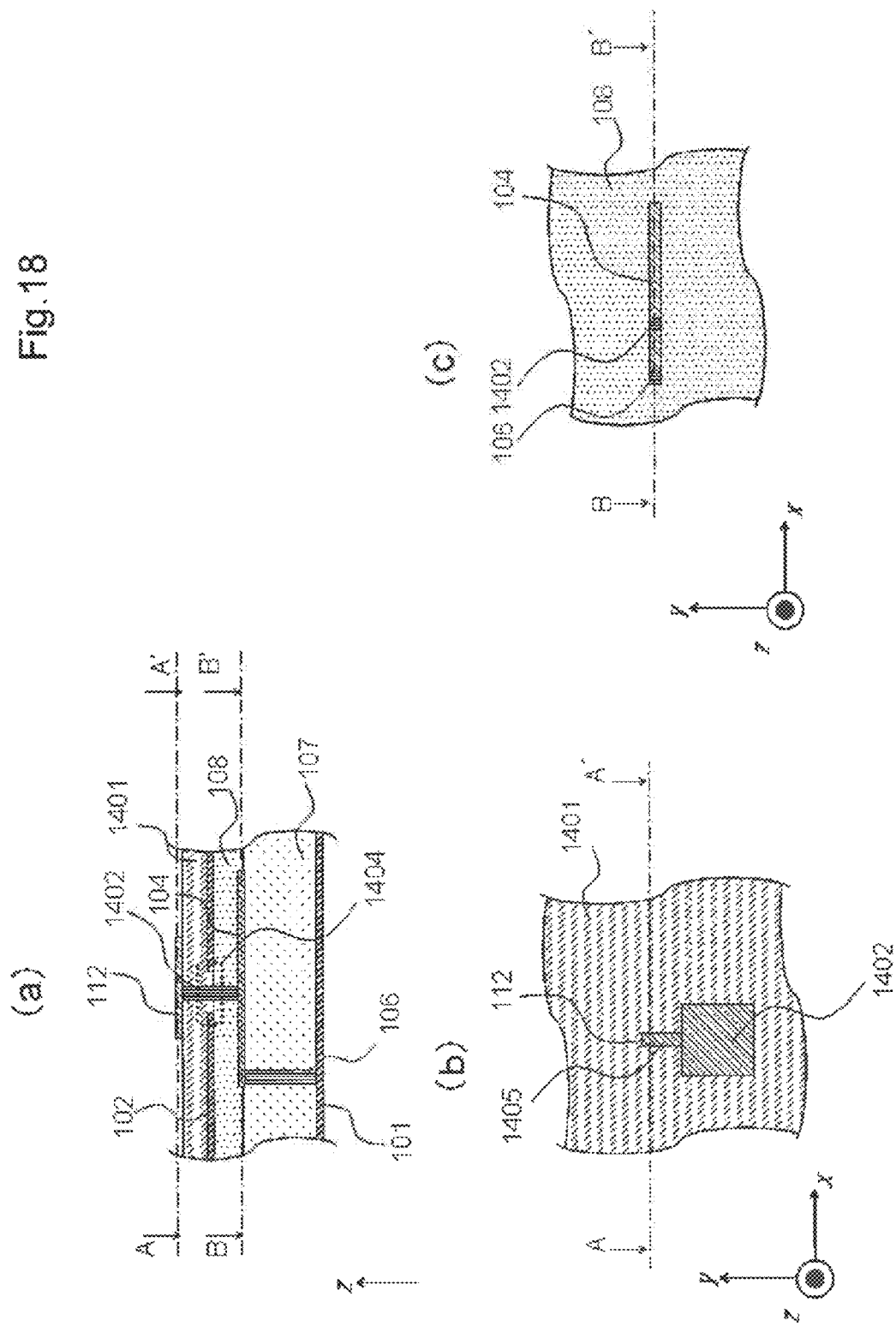
FIG. 18 illustrates views of another example of the unit structure of the EBG structure according to the third embodiment.

FIG. 17 and FIG. 18 illustrate cross-sectional views of unit structures of the EBG structure according to this embodiment based on the second embodiment. FIG. 17 (*a*) is a cross-sectional view taken along line A-A' in FIG. 17 (*b*) and also is a cross-sectional view taken along line B-B' in FIG. 17 (*c*); FIG. 17 (*b*) is a cross-sectional view taken along line A-A' in FIG. 17 (*a*); and FIG. 17 (*c*) is a cross-sectional view taken along line B-B' in FIG. 17 (a). FIG. 18 (a) is a cross-sectional view taken along line A-A' in FIG. 18 (b) and also is a cross-sectional view taken along line B-B' in FIG. 18 (c); FIG. 18 (b) is a cross-sectional view taken along line A-A' in FIG. 18 (a); and FIG. 18 (c) is a cross-sectional view taken along line B-B' in FIG. 18 (a).

In this configuration, as illustrated in FIG. 17 and FIG. 18, the fourth dielectric layer 1401 is additionally provided on the upper side of the second dielectric layer 108, and the structural body 105 that forms capacitance is arranged by use of the upper surface of the fourth dielectric layer 1401.

Specifically, as in the configuration based on the first embodiment, the structural body 105 that forms capacitance is composed of the conductor via 1402 and the insular conductor 112 or of the conductor via 1402, the conductor section 1405, and the insular conductor 112. FIG. 17 illustrates an example composed of the conductor via 1402 and the insular conductor 112. The insular conductor 112 is provided on the upper surface of the fourth dielectric layer 1401, and is electrically connected to the transmission line 104 by the conductor via 1402 extending in the thickness direction from the upper surface of fourth dielectric layer 1401 to the lower surface of the second dielectric layer 108. In this configuration, the clearance 1404 is provided to the second conductor plane 102 at a position corresponding to the conductor via 1402 in order to electrically separate the conductor via 1402 and second conductor plane 102 from each other. In FIG. 17, the insular conductor 112 and the transmission line 104 overlap each other in a top view, and therefore are connected to each other only by the conductor via 1402. In different arrangement where the insular conductor 112 and the transmission line 104 do not overlap each other in a top view, the conductor section 1405 for extending the insular conductor 112 to a position overlapping the transmission line 104 in a top view can be provided as illustrated in FIG. 18, so that insular conductor 112 and transmission line 104 can be connected to each other by the conductor section 1405 and the conductor via 1402. In FIG. 18, the insular conductor 112 is extended with the conductor section 1405 within the plane on which the insular conductor 112 is arranged. However, the transmission line 104 may be extended with the conductor section 1405 within the plane on which the transmission line 104 is disposed, so that the transmission line 104 and the insular conductor 112 are electrically connected to each other by the conductor section 1405 and the conductor via 1402. The insular conductor 112 faces the second conductor plane, and forms capacitance between the insular conductor 112 and the second conductor plane 102. Note here that, in the example illustrated in FIG. 18, the conductor via 106 and the conductor via 1402 are configured as non-penetrating vias. Specifically, the conductor via 106 penetrates only through the first dielectric layer 107, and the conductor via 1402 penetrates only through the fourth dielectric layer 1401 and the second dielectric layer 108.

As in the case of the first embodiment described above, the transmission line 104, the structural body 105 that forms capacitance, and the conductor via 106 function as a parallel admittance section. In this embodiment, the arrangement of the unit structures 103, the arrangement and shapes of the transmission lines 104, locations at which the insular conductors 112 constituting the structural bodies 105 that form capacitance are attached to the transmission lines 104, and the shapes of the insular conductors 112 are the same as described in the first embodiment.

Figure 19:
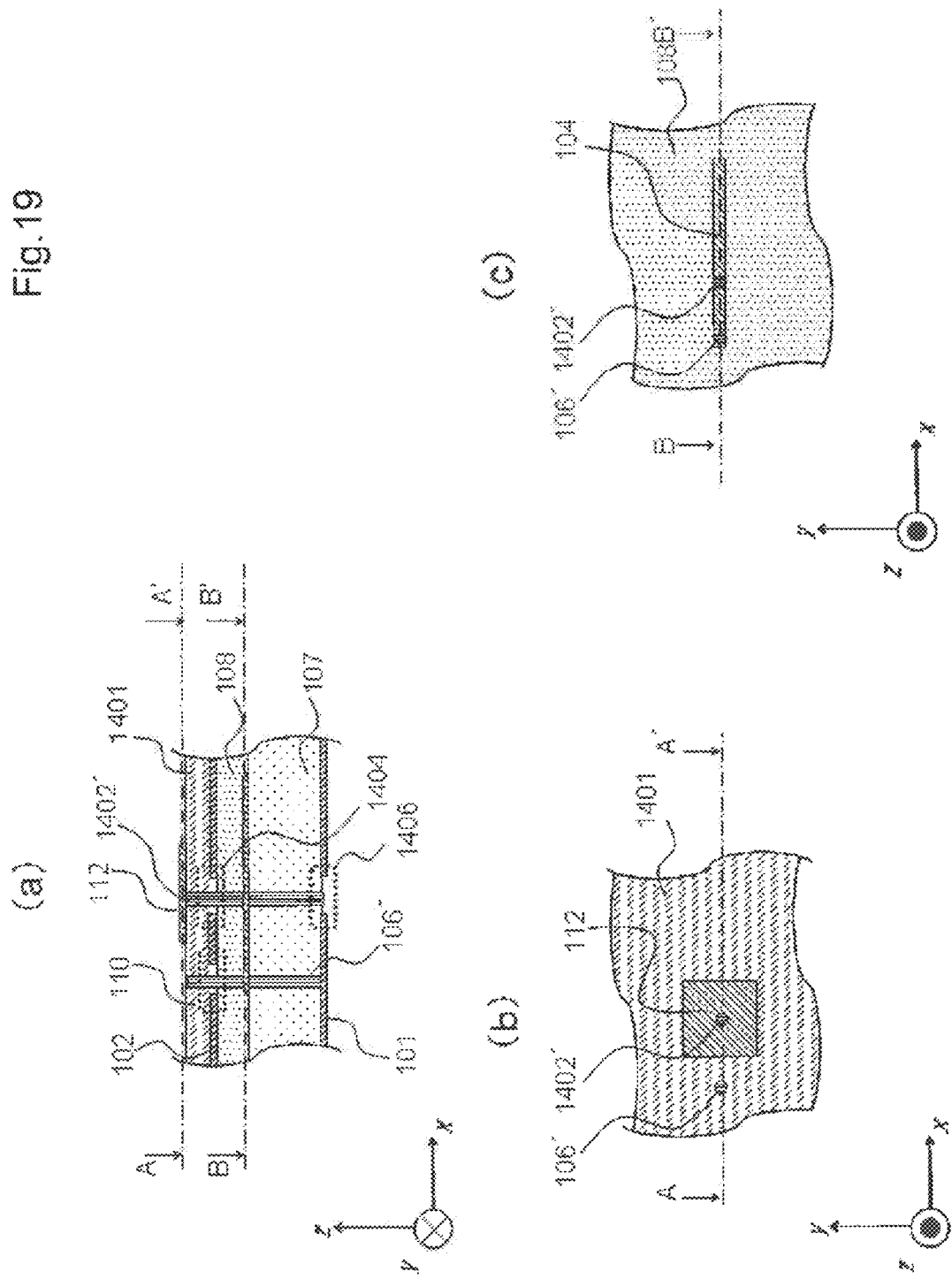
FIG. 19 illustrates views of another example of the unit structure of the EBG structure according to the third embodiment.

In the above-described configuration according to the third embodiment based on the second embodiment, the conductor via 1402 is present as a non-penetrating via as illustrated in FIG. 17 and FIG. 18. However, the conductor via 1402 may not necessarily be a non-penetrating via, as long as it electrically connects the second conductor plane 102 and the insular conductor 112 (or the conductor section 1405) to each other. For example, as illustrated in FIG. 19, a penetrating conductor via 1402' and a penetrating conductor via 106' may be provided in place of the non-penetrating conductor via 1402 and the non-penetrating conductor via 106, respectively, and these changes do not affect the effects of this embodiment at all.

Note here that, when the penetrating conductor via 1402' is used, it is necessary to provide the clearance 1406 in the first conductor plane 101 at a position corresponding to the conductor via 1402' in order to avoid an electrical contact between the conductor via 1402' and the first conductor plane 101. When the penetrating conductor via 106' is used, it is necessary to provide the clearance 110 in the second conductor plane 102 at a position corresponding to the conductor via 106' in order to avoid an electrical contact between the conductor via 106' and the second conductor plane 102. Furthermore, although FIG. 19 illustrates a configuration where the conductor via 106' and the conductor via 1402' are both penetrating vias, it is obvious that these vias may not necessarily be penetrating vias, and a configuration in which one of the vias is a penetrating via while the other via is a non-penetrating via is also thought possible.

Fourth Embodiment

The following describes the configuration of a structural body according to a fourth embodiment with reference to FIG. 20 to FIG. 29. This embodiment is a modification example of the first to third embodiments, and descriptions of the same components as those in the first to third embodiments are omitted. This embodiment differs from the first to third embodiments in the structure and operation of the structural body 105 that forms capacitance. This embodiment differs from the first to third embodiments in that the structural body 105 that forms capacitance is a transmission line. One end of this transmission line is configured as an open end.

Figure 20:
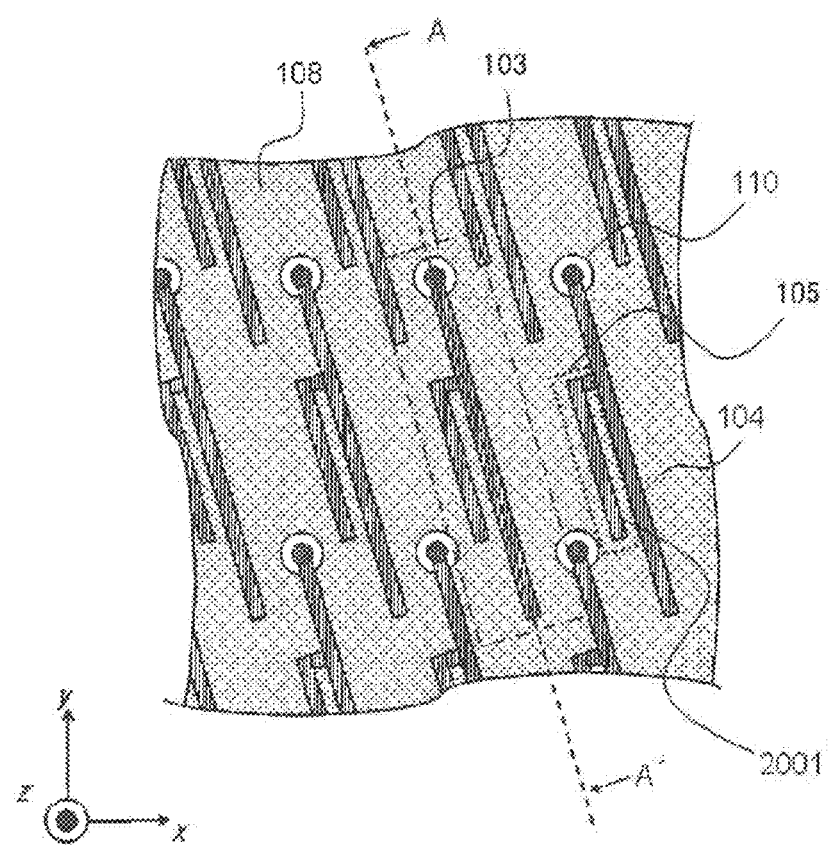
FIG. 20 is a view of an example of an EBG structure according to a fourth embodiment.
Figure 21:
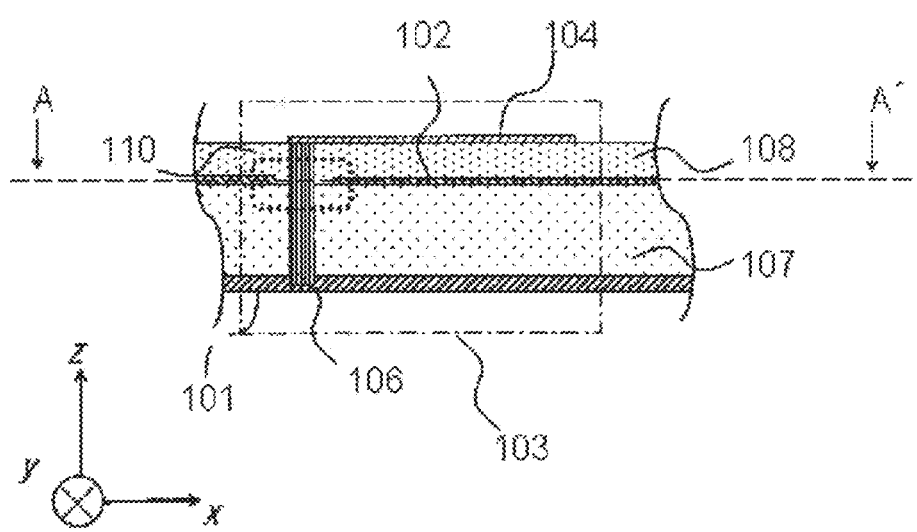
FIG. 21 is a view of an example of a unit structure of the EBG structure according to the fourth embodiment.

FIG. 20 and FIG. 21 are cross-sectional views of a configuration of this embodiment that is based on the first embodiment. In this configuration of this embodiment based on the first embodiment, the transmission line 104 is arranged on the upper surface of the second dielectric layer 108. FIG. 20 is a cross-sectional view taken along line A-A' in FIG. 21, and FIG. 21 is a cross-sectional view taken along line A-A' in FIG. 20. The embodiment illustrated in FIG. 20 and FIG. 21 differs from the first embodiment illustrated in FIG. 1 and FIG. 2 only in the shape of the structural body 105 that forms capacitance, and the other components thereof are the same as those of the first embodiment illustrated in FIG. 1 and FIG. 2.

In this embodiment based on the first embodiment, the structural body 105 that forms capacitance is composed of a second transmission line 2001 disposed in the same plane as a plane on which the transmission line 104 is disposed. The second transmission line 2001 is disposed on a plane facing the second conductor plane 102 as in the case of the transmission line 104, and is configured as a transmission line for which the second conductor plane 102 serves as a return path. One end of the second transmission line 2001 is configured as an open end, and functions as an open stub.

The other end of the second transmission line 2001 is attached to an intermediate portion of the transmission line 104.

Figure 22:
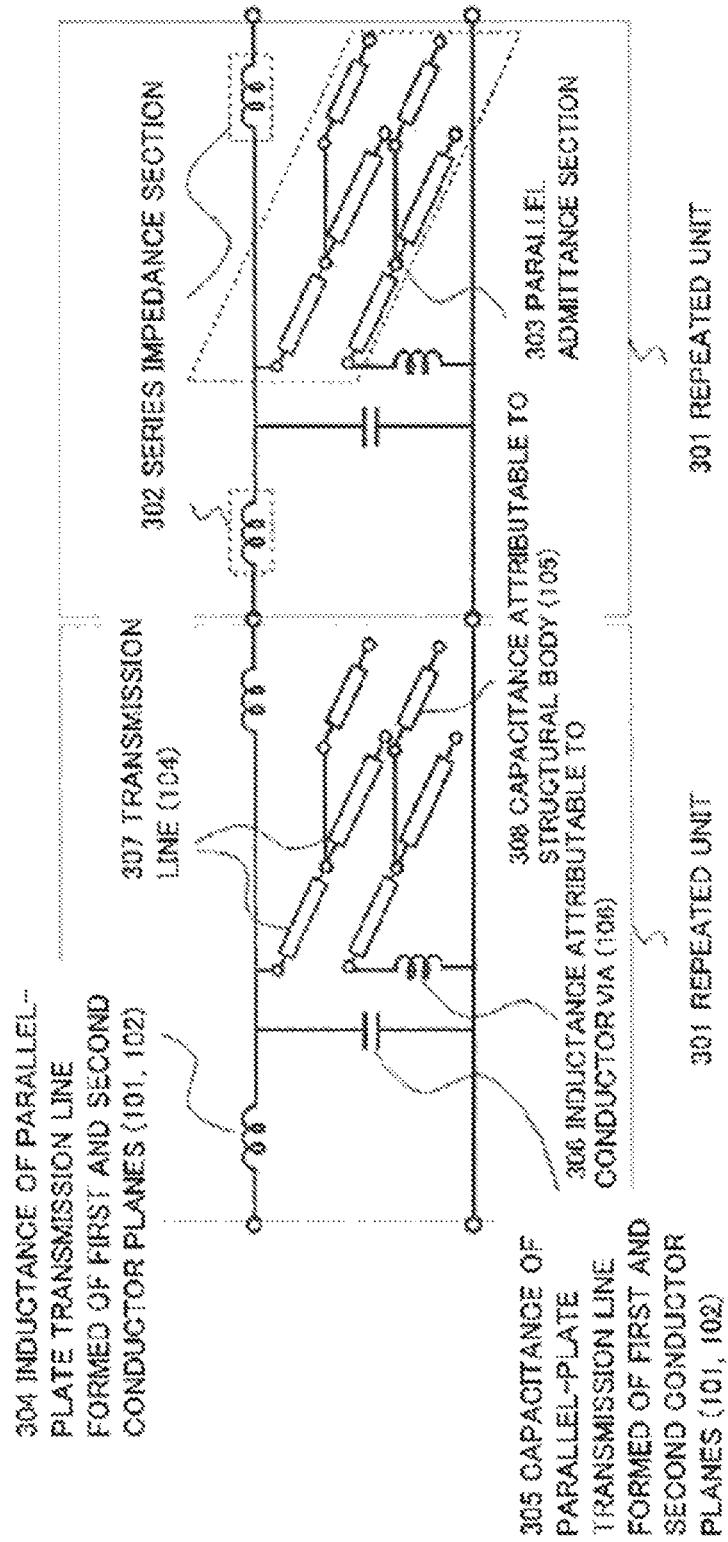
FIG. 22 is an equivalent circuit diagram of the EBG structure according to the fourth embodiment.

FIG. 22 illustrates an equivalent circuit for this embodiment in a direction along an arbitrary straight line on the x-y plane. The equivalent circuit for this embodiment is the same as the one illustrated in FIG. 3, which is an equivalent circuit diagram for the first embodiment, except that a part where the capacitance 308 formed by the structural body is generated by the second transmission line 2001, one end of which is an open end, is present as a transmission line model. The admittance of the second transmission line (the structural body that forms capacitance), one end of which is an open end, is represented by expression (4) instead of expression (3) for the first embodiment.

[Mathematical Expression 4]

$$Y_{sh} = jY_{st0} \tan \beta_{st} l_{st},  \quad (4)$$

where the symbols are defined as follows:

$Y_{st0}$, characteristic admittance of a transmission line, which is the structural body, put on an intermediate portion of another transmission line;

$\beta_{st}$, phase constant of the transmission line, which is the structural body, put on the intermediate portion of the other transmission line; and $l_{st}$, transmission line length of the transmission line, which is the structural body, put on the intermediate portion of the other transmission line.

As can be easily found from expression (4), the admittance of the structural body 105 put on the intermediate portion of the transmission line 104 behaves as capacitance when the phase $\beta_{st} l_{st}$ of the tangent part (tan part) in expression (4) is less than $\pi/2$. Specifically, since capacitance can be formed with a transmission line one end of which is an open end, the descriptions for the first embodiment can apply to this embodiment.

In this embodiment, the arrangement of the unit structures 103, the arrangement and shapes of the transmission lines 104, locations at which the structural bodies 105 that form capacitance are attached to the transmission lines 104, and the shapes of the structural bodies 105 are the same as described in the first embodiment. Specifically, the transmission line 104 may not necessarily have a linear shape, and may have a meandering shape, a spiral shape, or even a totally irregularly extended shape. Such a case allows for a longer transmission line length in a small mounting area. As in the case of the first embodiment, a configuration having a plurality of transmission lines 104 attached to one of the conductor vias 106 is also thought possible. Furthermore, obviously, a structure having a plurality of second transmission lines 2001, each of which is the structural body 105 that forms capacitance, provided with respect to each one of the transmission lines 104 is also thought possible.

Figure 23:
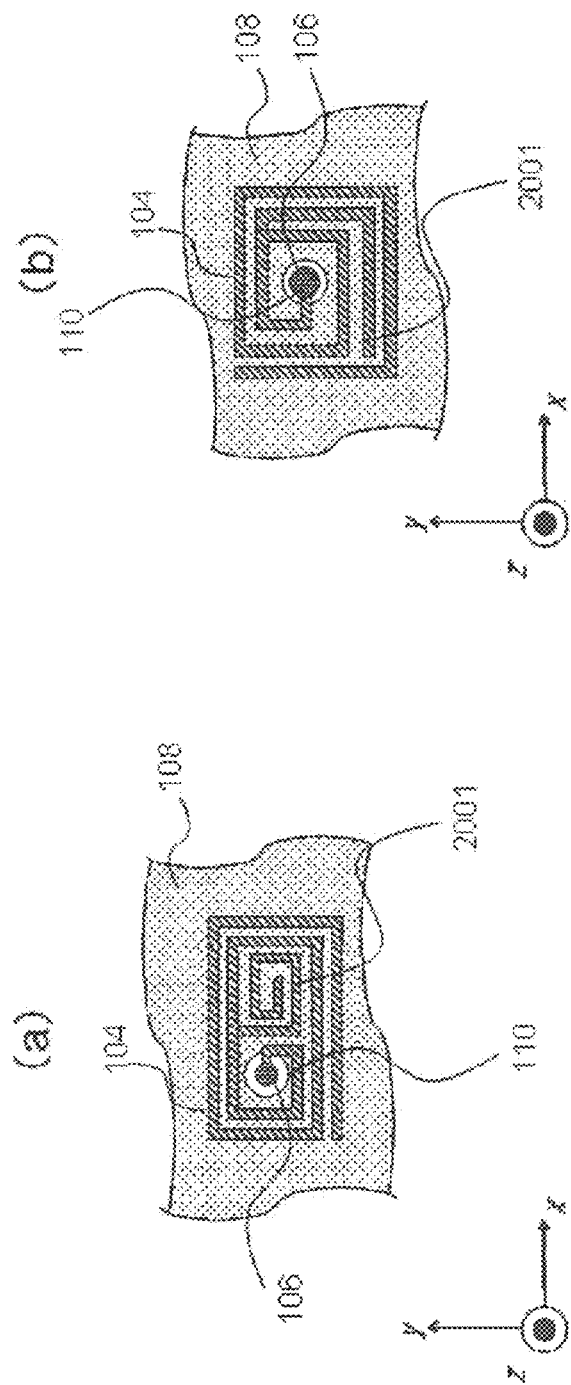
FIG. 23 illustrates views of examples of the unit structure of the EBG structure according to the fourth embodiment.

As in the case of the transmission line 104, the shape of the second transmission line 2001, which is the structural body 105 that forms capacitance, may not necessarily be a linear shape, and may be a meandering shape, a spiral shape, or even a totally irregularly extended shape. FIG. 23 illustrates cross-sectional views each illustrating a unit structure of this embodiment with the spiral-shaped transmission line 104 and with the spiral-shaped second transmission line 2001 attached thereto. FIG. 23 (a) is an example where the transmission line 104 and the second transmission line 2001 form spiral shapes independently of each other, and FIG. 23 (b) is an example where the transmission line 104 and the second transmission line 2001 form spiral shapes entangled with each other. Other than those illustrated in FIG. 23, other various cases where the transmission line 104 and the second transmission line 2001 are differently extended are thought possible, including: a case where the transmission line 104 has a meandering shape and the second transmission line 2001 has a spiral shape; a case where the transmission line 104 has a spiral shape and the second transmission line 2001 has a meandering shape; a case where the transmission line 104 and the second transmission line 2001 both have a meandering shape; and a case where the transmission line 104 and the second transmission line 2001 both have an irregularly extended shape.

Figure 24:
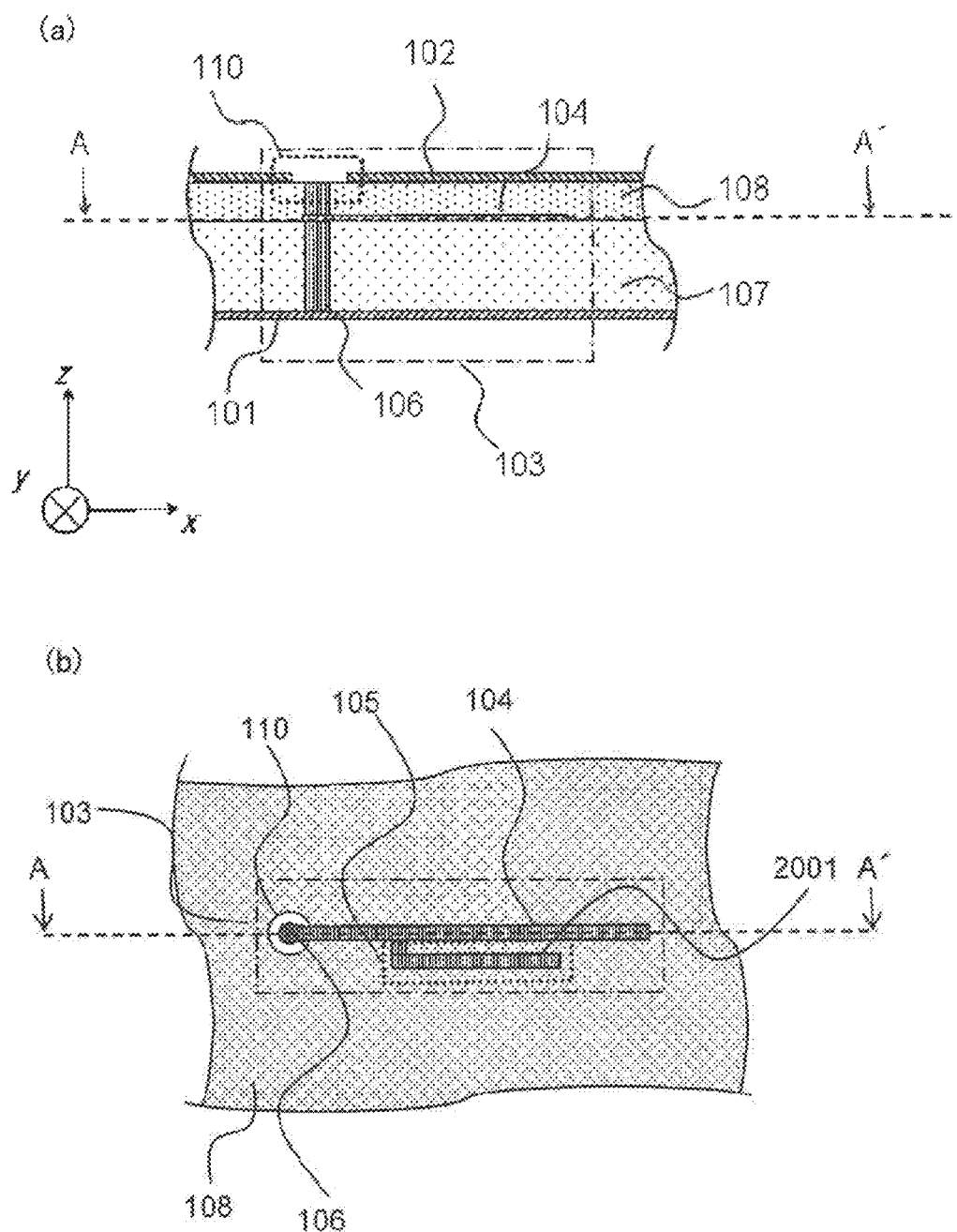
FIG. 24 illustrates views of another example of the unit structure of the EBG structure according to the fourth embodiment.
Figure 25:
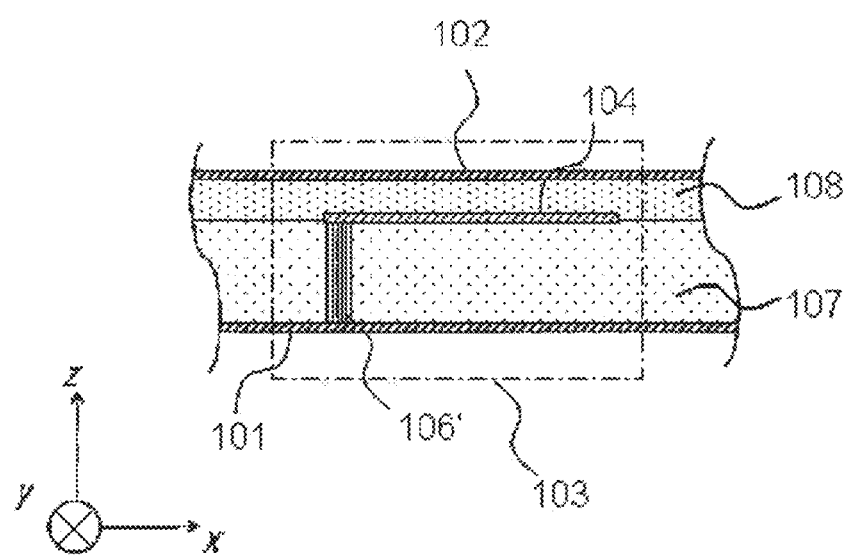
FIG. 25 is a view of another example of the unit structure of the EBG structure according to the fourth embodiment.

The following describes, with reference to FIG. 24 and FIG. 25, configurations according to this embodiment that are based on the second embodiment. FIG. 24 and FIG. 25 illustrate cross-sectional views of unit structures of an EBG structure according to this embodiment based on the second embodiment. FIG. 24 (a) is a cross-sectional view taken along line A-A' in FIG. 24 (b); and FIG. 24 (b) is a cross-sectional view taken along line A-A' in FIG. 24 (a). FIG. 25 illustrates an example where the conductor via 106 in FIG. 24 is configured as a non-penetrating via, and is a cross-sectional view corresponding to the cross-sectional view in FIG. 24 (a).

In each configuration according to this embodiment based on the second embodiment, the transmission line 104 is disposed on the upper surface of the first dielectric layer 107. Each configuration according to this embodiment based on the second embodiment differs from that of the second embodiment only in the shape of the structural body 105 that forms capacitance. The other components are the same as those of the second embodiment, and descriptions thereof are omitted.

In each configuration according to this embodiment based on the second embodiment, the structural body 105 that forms capacitance is composed of the second transmission line 2001 disposed on the same plane as a plane on which the transmission line 104 is disposed. As in the case of the transmission line 104, the second transmission line 2001 is disposed on a plane facing the second conductor plane 102, and is configured as a transmission line for which the second conductor plane 102 serves as a return path. One end of the second transmission line 2001 is configured as an open end to function as an open stub. The other end of the second transmission line 2001 is attached to an intermediate portion of the transmission line 104.

In the configuration of this embodiment, the arrangement of the unit structures 103, the arrangement and shapes of the transmission lines 104, locations at which the second transmission lines 2001 that are structural bodies 105 that form capacitance are attached to the transmission lines 104, and the shapes of the second transmission lines 2001 are the same as described in the above-described configuration according to this embodiment based on the first embodiment. In the EBG structure according to this embodiment based on the second embodiment, the transmission line 104 and the second transmission line 2001 (the structural body 105 that forms capacitance) are shielded by the two conductor planes 101 and 102, unwanted electromagnetic waves that radiate to the outside from the structural body 105 that forms capacitance and from the transmission line 104 can be reduced.

In the above-described configuration according to this embodiment based on the second embodiment, the conductor via 106 is present as a penetrating via, as illustrated in FIG. 24. The conductor via 106 may not necessarily be a penetrating via, as long as the conductor via 106 and the first conductor plane 101 are electrically connected to each other. For example, as illustrated in FIG. 25, the conductor via 106' that is a non-penetrating via may be provided, and this change does not affect the effects of this embodiment at all. The EBG structure illustrated in FIG. 25 avoids the necessity of providing the clearance 110 in the second conductor plane 102, whereby electromagnetic wave radiation through a portion of the clearance 110 to the outside can be eliminated.

The following describes, with reference to FIG. 26 to FIG. 29, configurations according to this embodiment that are based on the third embodiment. FIG. 26 to FIG. 29 illustrate cross-sectional views of unit structures of an EBG structure according to this embodiment based on the third embodiment. In each of FIGS. 26 to 29, (a) is a cross-sectional view taken along line A-A' in (b) and also is a cross-sectional view taken along line B-B' in (c). In each of FIGS. 26 to 29, (b) is a cross-sectional view taken along line A-A' in (a). In each of FIGS. 26 to 29, (c) is a cross-sectional view taken along line B-B' in (a). Since each of the configurations according to this embodiment based on the third embodiment differs from the third embodiment only in that the structural body 105 that forms capacitance is composed of the transmission line 2001, redundant descriptions are omitted. In each of these configurations, the second transmission line 2001 one end of which is an open end is provided in place of the insular conductor 112 according to the third embodiment.

FIG. 26 (a) is a cross-sectional view of a configuration according to this embodiment based on the configuration according to the third embodiment where the transmission line 104 is disposed on the upper surface of the second dielectric layer 108. In this configuration, the structural body 105 (second transmission line 2001) that forms capacitance is formed in the lower surface of the fourth dielectric layer 1401 (in a layer that does not have the transmission line 104 among the layers facing the second conductor plane 102). The second transmission line 2001 is configured as a transmission line for which the second conductor plane serves as a return path, and the other end thereof, which is not an open end, is connected to an intermediate portion of the transmission line 104 by the conductor via 1402.

In this configuration according to this embodiment, the arrangement of the unit structures 103, the arrangement and shapes of the transmission lines 104, locations at which the structural bodies 105 (second transmission lines 2001) that form capacitance are attached to the transmission lines 104, and the shapes of the structural bodies 105 (second transmission lines 2001) are the same as described for the above-described configuration according to this embodiment that is based on the first embodiment.

Figure 27:
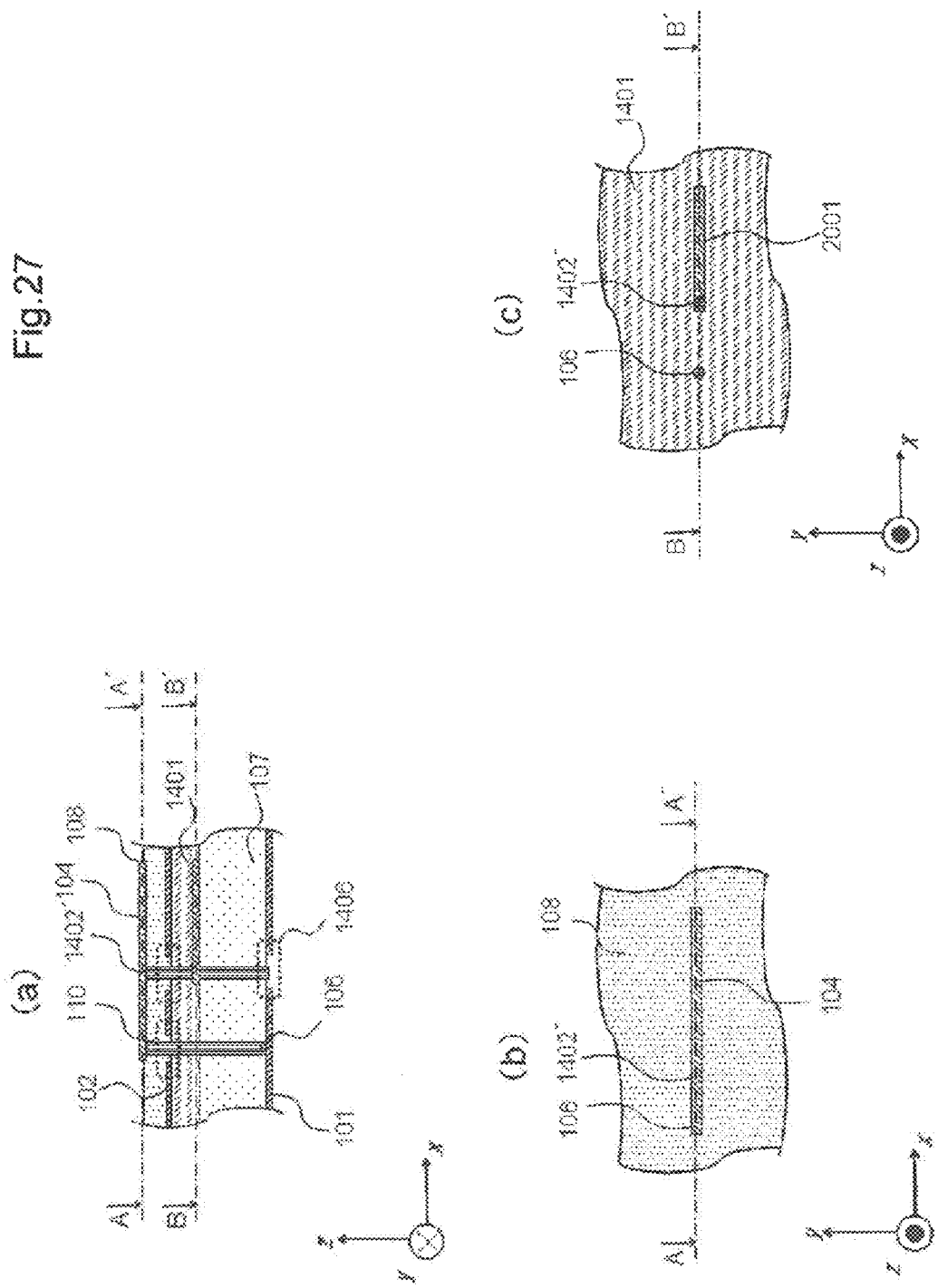
FIG. 27 illustrates views of another example of the unit structure of the EBG structure according to the fourth embodiment.

Although FIG. 26 explains a case where the conductor via 1402 is a non-penetrating via, another configuration where a penetrating via is provided in place of the non-penetrating via as in the case of the third embodiment is obviously also possible. For example, as illustrated in FIG. 27, a configuration in which the conductor via 1402' is provided in place of the conductor via 1402 is possible. With this configuration, it is necessary to provide the clearance 1406 to electrically separate the conductor via 1402' and the first conductor plane 101 from each other.

Figure 28:
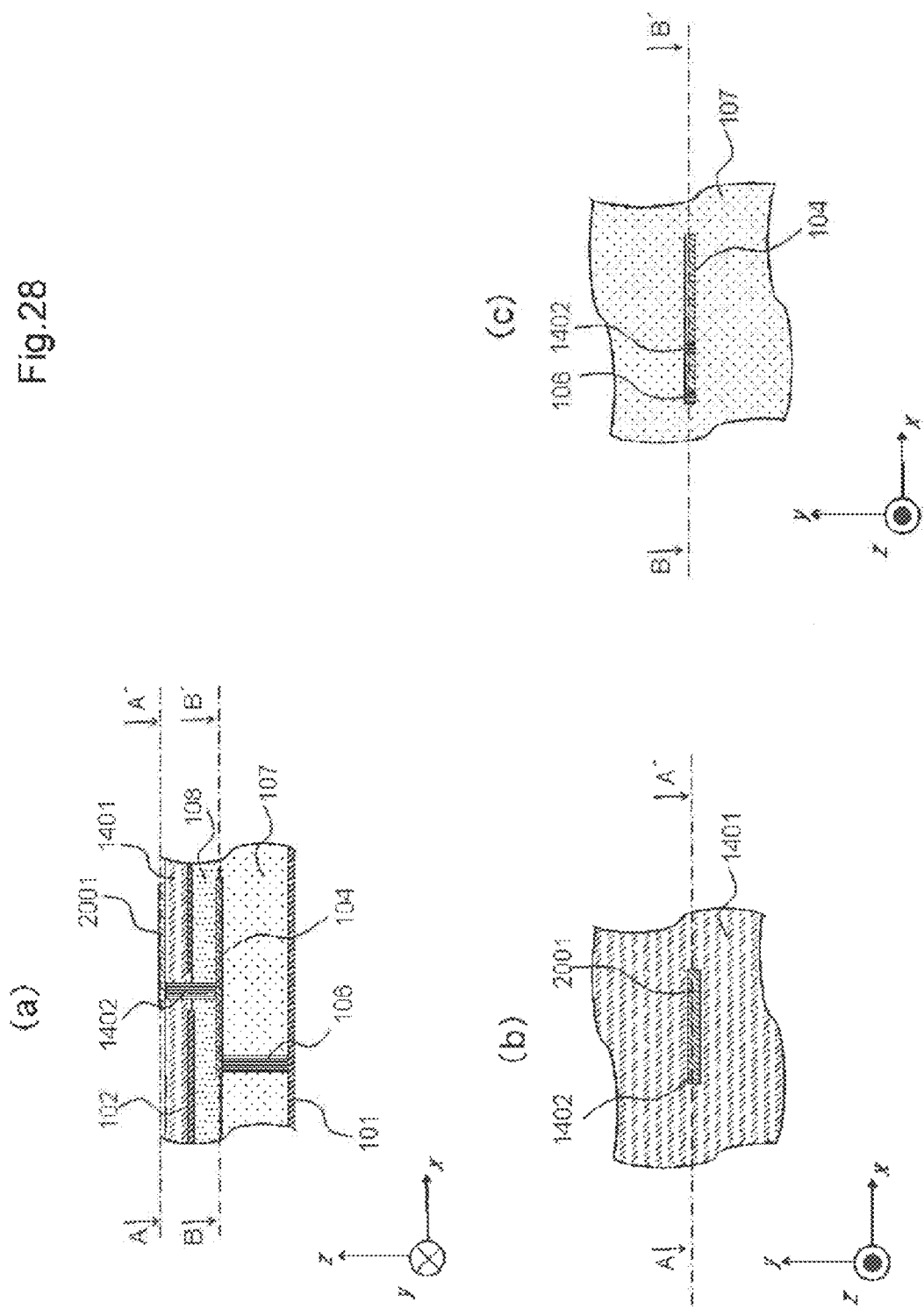
FIG. 28 illustrates views of another example of the unit structure of the EBG structure according to the fourth embodiment.

FIG. 28 illustrates cross-sectional views of another configuration according to this embodiment based on the configuration according to the third embodiment where the transmission line 104 is disposed on the upper surface of the first dielectric layer 107. In this configuration, the structural body 105 (second transmission line 2001) that forms capacitance is formed on the upper surface of the fourth dielectric layer 1401 (in a layer that does not have the transmission line 104 among the layers facing the second conductor plane 102). The second transmission line 2001 is configured as a transmission line for which the second conductor plane serves as a return path, and the other end thereof, which is not an open end, is connected to an intermediate portion of the transmission line 104 by the conductor via 1402.

In this configuration according to this embodiment, the arrangement of the unit structures 103, the arrangement and shapes of the transmission lines 104, locations at which the structural bodies 105 (second transmission lines 2001) that form capacitance are attached to the transmission lines 104, and the shapes of the structural bodies 105 (second transmission lines 2001) are the same as described for the above-described configuration according to this embodiment that is based on the first embodiment.

Although FIG. 28 explains a case where the conductor via 1402 is a non-penetrating via, another configuration where a penetrating via is provided in place of the non-penetrating via as in the case of the third embodiment is obviously also possible. For example, as illustrated in FIG. 29, a configuration in which the conductor via 1402' is provided instead of the conductor via 1402 is possible. With this configuration, it is necessary to provide the clearance 1406 to electrically separate the conductor via 1402' and the first conductor plane 101 from each other.

Fifth Embodiment

Figure 31:
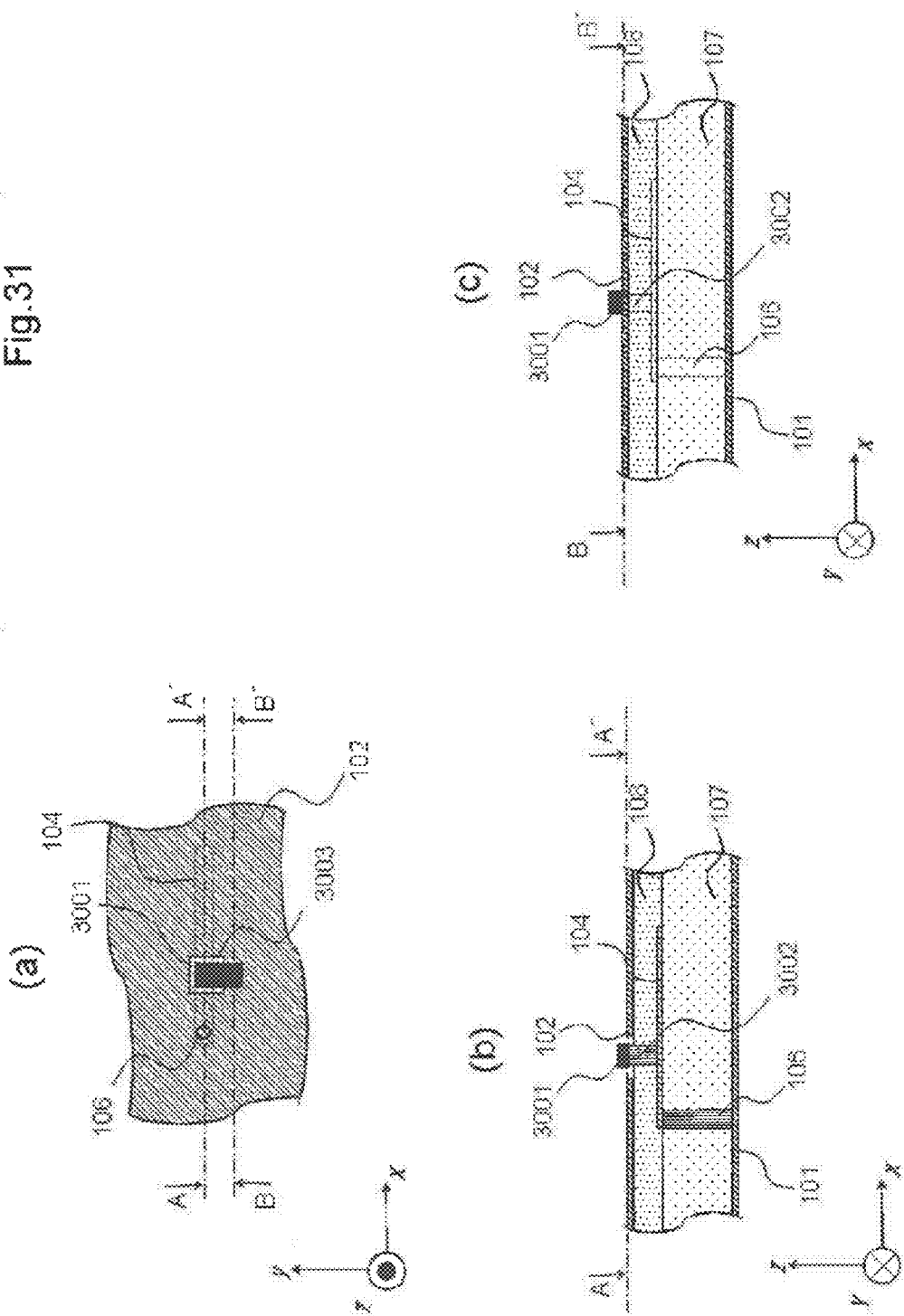
FIG. 31 illustrates views of another example of the unit structure of the EBG structure according to the fifth embodiment.

The following describes configurations of the structural body according to a fifth embodiment with reference to FIG. 30 and FIG. 31. FIG. 30 and FIG. 31 illustrate cross-sectional views of unit structures of an EBG structure according to this embodiment. FIG. 30 (a) is a cross-sectional view taken along line A-A' in FIG. 30 (b) and also is a cross-sectional view taken along line B-B' in FIG. 30 (c). FIG. 30 (b) is a cross-sectional view taken along line A-A' in FIG. 30 (a); and FIG. 30 (c) is a cross-sectional view taken along B-B' line in FIG. 30 (a). FIG. 31 (a) is a cross-sectional view taken along line A-A' in FIG. 31 (b) and also is a cross-sectional view taken along line B-B' in FIG. 31 (c). FIG. 31 (b) is a cross-sectional view taken along line A-A' in FIG. 31 (a); and FIG. 31 (c) is a cross-sectional view taken along B-B' line in FIG. 31 (a). The EBG structure according to this embodiment is a modification example of the above-described EBG structure according to the first embodiment. Therefore, the same reference signs are assigned to the same components as those in the first embodiment, and descriptions thereof are omitted.

The EBG structure according to this embodiment is characterized in that the structural body 105 that forms capacitance includes a chip capacitor as a component, for example, as illustrated in FIG. 30 or FIG. 31. More specifically, in the EBG structure according to this embodiment, one terminal of a chip capacitor 3001 is electrically connected to the conductor plane 102 directly or by a wiring section or a conductor via, and the other terminal is attached to an intermediate portion of the first transmission line 104.

For example, in the example in FIG. 30, the chip capacitor 3001 is provided on the upper side of the second dielectric layer 108. One end of the chip capacitor 3001 is directly attached to an intermediate portion of the transmission line 104, and the other end thereof is connected to the second conductor plane 102 by the conductor via 3002. Obviously, how the chip capacitor 3001 is connected is not limited to the configuration of this example, and various configurations are considered possible, including: a configuration in which it is connected by an additional conductive wiring section; and a configuration in which it is connected by another conductor via.

In this embodiment, the arrangement of the unit structures 103, the arrangement and shapes of the transmission lines 104, and locations at which the structural bodies 105 that form capacitance are attached to the transmission lines 104 are the same as described for the first embodiment.

Although FIG. 30 illustrates an example of a configuration where the transmission line 104 is located above the second conductor plane 102, this embodiment is obviously applicable also to a configuration where the transmission line 104 is disposed in a region sandwiched between the first conductor plane 101 and the second conductor plane 102. FIG. 31 illustrates one example of such a configuration, where, while the chip capacitor 3001 is provided on the second conductor plane 102, one terminal end of the chip capacitor 3001 is directly attached to the conductor plane 102. The other end of the chip capacitor 3001 is connected to an intermediate portion of the transmission line 104 by the conductor via 3002.

According to this embodiment, easy addition of capacitance having a large capacity in a small mounting area is allowed by the use of the chip capacitor 3001. In the present invention, the amount of a bandgap shift is larger as capacitance formed between the structural body 105 that forms capacitance and the conductor plane 102 is larger. This embodiment makes it possible to provide an EBG structure in which the amount of a bandgap shift is large with a small mounting area.

Sixth Embodiment

Figure 32:
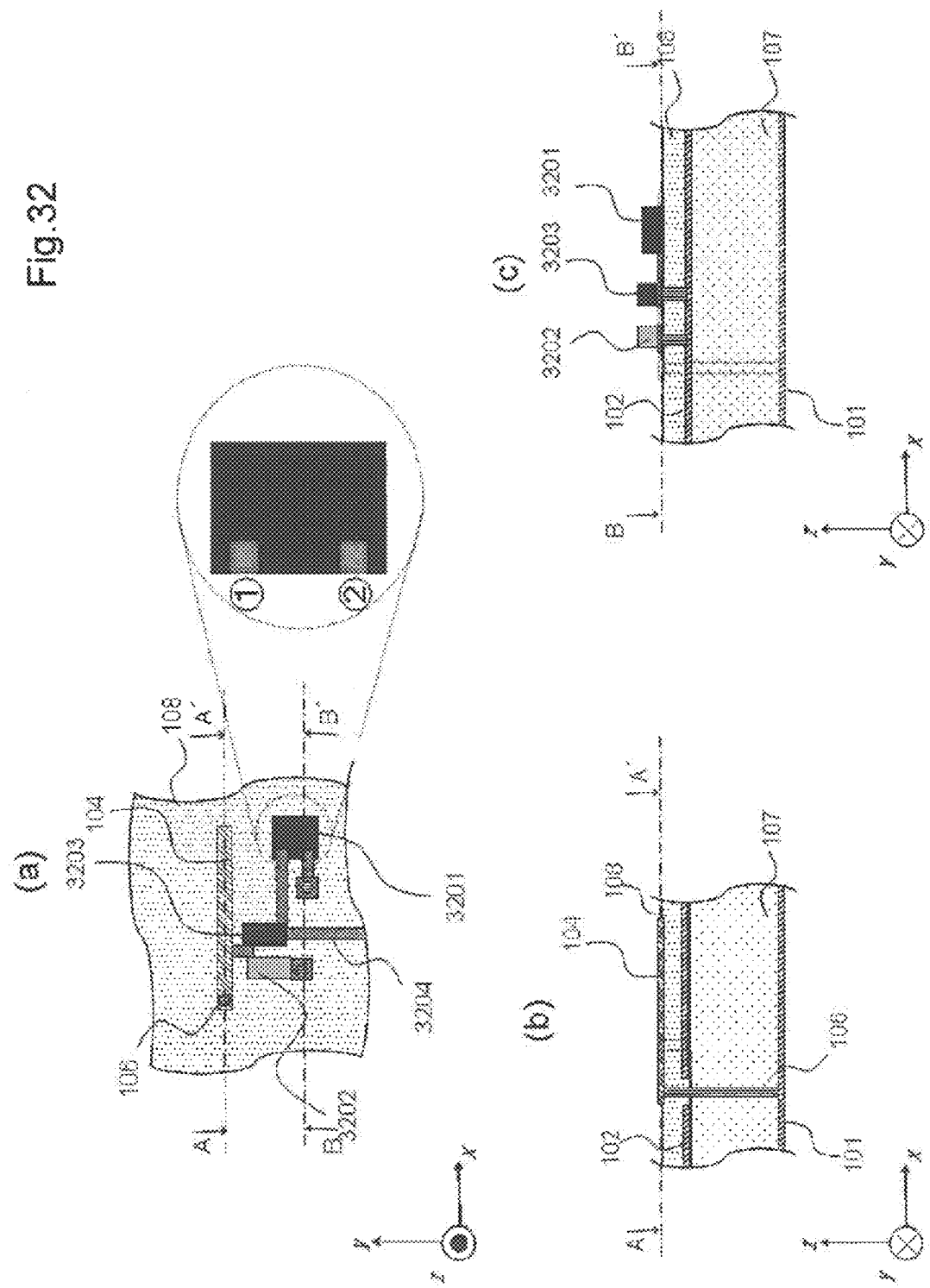
FIG. 32 illustrates views of an example of the unit structure of the EBG structure according to a sixth embodiment.

The following describes configurations of the sixth embodiment with reference to FIG. 32. FIG. 32 (a) is a cross-sectional view taken along line A-A' in FIG. 32 (b) and also is a cross-sectional view taken along line B-B' in FIG. 32 (c). FIG. 32 (b) is a cross-sectional view taken along line A-A' in FIG. 32 (a), and FIG. 32 (c) is a cross-sectional view taken along line B-B' in FIG. 32 (a). An EBG structure according to this embodiment is a modification example of the above-described EBG structure according to the first embodiment. Therefore, the same reference signs are assigned to the same components as those in the first embodiment described above, and descriptions thereof are omitted.

The EBG structure according to this embodiment is characterized in that the structural body that forms capacitance is a structural body with a variable capacity value, namely, a variable capacitor. Such a structural body is, for example, a varicap. Other than a varicap, specific examples considered as the structural body include a microelectromechanical system (MEMS)-based variable capacitor and a variable capacitor produced by the application of a GaAs JPHEMT (junction pseudomorphic high electron mobility transistor) process. FIG. 32 illustrates views of a specific example using a varicap. Here, the case using a varicap is described as one example in further detail. When a varicap is used, a circuit that controls the varicap is typically provided in addition to the varicap.

Figure 33:
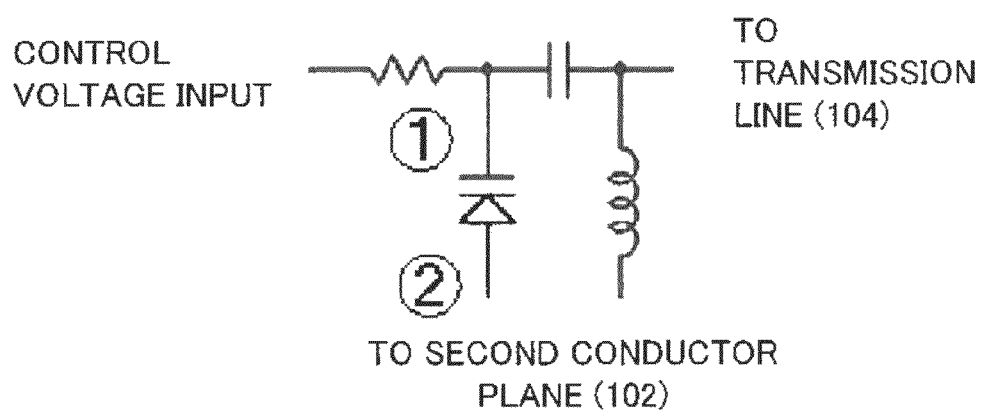
FIG. 33 is a circuit diagram for controlling constituent parts of the EBG structure according to the sixth embodiment.

FIG. 33 illustrates one example of a control circuit diagram. FIG. 32 illustrates views based on an example of the circuit illustrated in FIG. 33. Specifically, a structural body 3201 that forms capacitance, the capacity value of which is adjustable, is attached so that capacitance can be formed between an intermediate portion of the transmission line 104 and the second conductor plane 102. In FIG. 32, chip components such as an inductor 3202 and a capacitor 3203 are attached pursuant to the circuit diagram of FIG. 33. Specifically, one terminal end of the inductor 3202 and one terminal end of the capacitor 3203 are attached to an intermediate portion of the transmission line 104. The other terminal end of the inductor 3202 is connected to the second conductor plane 102 by a conductor via. The other terminal end of the capacitor 3203 is attached to a terminal α of the structural body 3201 the capacity value of which is adjustable. A terminal β of the structural body 3201 the capacity value of which is adjustable is connected to the second conductor plane 102 by a conductor via. The terminal α of the structural body 3201 the capacity value of which is adjustable is connected not only to a terminal of the capacitor 3203 but also to the electric supply line 3204 for supplying direct-current (DC) voltage from the outside. The capacity value can be made variable by varying the value of this DC voltage. Since the circuit illustrated in FIG. 32 is one example, it is obvious that, other than this example, various examples of the control circuit are considered possible that differ in such points as configuration of components, arrangement of components, and wiring arrangement. In an example where capacitance is made variable by the application of another scheme such as a MEMS-based technique, wiring for supplying digital control signals, for example, may be required.

Although FIG. 32 illustrate an example of a configuration where the transmission line 104 is located above the second conductor plane 102, this embodiment is obviously applicable also to a configuration where the transmission line 104 is disposed in a region sandwiched between the first conductor plane 101 and the second conductor plane 102.

According to this embodiment, adjustment of the capacitance value between the second conductor plane 102 and the intermediate portion of the transmission line 104 is allowed by the use of a structural body the capacity value of which is variable. Allowing this adjustment is allowing the amount of a bandgap shift to be variable. In other words, this embodiment makes it possible to provide an EBG structure in which the amount of a bandgap shift can be actively controlled.

Furthermore, as described above, adjustable bandgaps are different depending on positions at which structural bodies that form capacitance are attached to the transmission lines 104. In other words, with structural bodies, the capacity values of which are variable, attached at positions such that the bandgaps can be adjusted, the amounts of shift of the bandgaps can be actively controlled independently of one another through adjustment of the capacity values of the corresponding structural bodies the capacity values of which are variable.

Although the embodiments of the present invention are described as above with reference to the drawings, these embodiments are presented merely as examples of the present invention, and various configurations other than the above ones can be adopted.

The present invention is disclosed as follows according to the above embodiments.

(Note 1) A structural body including:

a first conductor;

a second conductor that is formed in a layer different from a layer in which the first conductor is formed, and that faces the first conductor;

a first transmission line that is formed in a layer different from the layers in which the first conductor and the second conductor are formed, that faces the second conductor, and that has one end being an open end, a first conductor via connecting the other end of the first transmission line and the first conductor; and a capacitance imparting member that is connected to the first transmission line and that forms capacitance between the capacitance imparting member and the second conductor.

(Note 2) The structural body according to Note 1, wherein the first conductor, the second conductor, the first transmission line, the first conductor via, and the capacitance imparting member form an electromagnetic bandgap (EBG) structure.

(Note 3) The structural body according to Note 1 or 2, wherein the capacitance imparting member is a third conductor facing the second conductor.

(Note 4) The structural body according to Note 1 or 2, wherein the capacitance imparting member is a second transmission line, and one end of the second transmission line is connected to the first transmission line, and the other end thereof is an open end.

(Note 5) The structural body according to Note 1 or 2, wherein the capacitance imparting member is a chip capacitor.

(Note 6) The structural body according to Note 1 or 2, wherein the capacitance imparting member is a variable capacitor.

(Note 7) The structural body according to any one of Notes 1 to 6, wherein the capacitance imparting member is attached to the first transmission line at or near the open end thereof.

(Note 8) The structural body according to any one of Notes 1 to 6, wherein, when the first transmission line has a length $l_{os}$, the capacitance imparting members are attached to the first transmission line at positions each located between positions $(2k-2)l_{os}/2n - l_{os}/4n$ away and $(2k-2)l_{os}/(2n-1) + l_{os}/4n$ (for $k=2, \ldots, n$) away from the open end or between positions $(2k-2)l_{os}/2n$ and $(2k-2)l_{os}/(2n-1) + l_{os}/4n$ (for $k=1$) away from the open end.

(Note 9) A wiring board including:

a first conductor;

a second conductor that is formed in a layer different from a layer in which the first conductor is formed, and that faces the first conductor;

a first transmission line that is formed in a layer different from the layers in which the first conductor and the second conductor are formed, that faces the second conductor, and that has one end being an open end, a first conductor via that connects the other end of the first transmission line and the first conductor; and a capacitance imparting member that is connected to the first transmission line and that forms capacitance between the capacitance imparting member and the second conductor.

(Note 10) The wiring board according to Note 9, wherein the first conductor, the second conductor, the first transmission line, the first conductor via, and the capacitance imparting member form an electromagnetic bandgap (EBG) structure.

(Note 11) The structural body according to Note 1, wherein the capacitance imparting member includes an insular conductor present within the same plane as a plane on which the first transmission line is disposed.

(Note 12) The structural body according to Note 1, wherein the capacitance imparting member includes:

an insular conductor located to face one side of the second conductor, the one side not facing the first transmission line; and a second conductor via connecting the insular conductor to the first transmission line.

(Note 13) The structural body according to Note 4, wherein the second transmission line includes a second transmission line present within the same plane as a plane on which the first transmission line is disposed.

(Note 14) The structural body according to Note 4, wherein the second transmission line is located to face one side of the second conductor, the one side not facing the first transmission line, and the structural body further includes a second conductor via connecting one end of the second transmission line and the first transmission line.

(Note 15) The structural body according to any one of Notes 1 to 8 and 11 to 14, wherein the first transmission line is located to face one side of the second conductor, the one side not facing the first conductor, and the second conductor and the first conductor via are electrically separated from each other.

(Note 16) The structural body according to any one of Notes 1 to 8 and 11 to 15, wherein the first transmission line is located between the second conductor and the first conductor in a direction in which layers are stacked.

(Note 17) The structural body according to any one of Notes 1 to 8 and 11 to 16, wherein the capacitance imparting member is attached to the first transmission line at a position the distance of which from the open end is equal to or larger than ($\frac{1}{2} - \frac{1}{8}$) of the length of the first transmission line and is equal to or smaller than ($\frac{2}{3} + \frac{1}{8}$) thereof.

(Note 18) The structural body according to any one of Notes 1 to 8 and 11 to 16, wherein the capacitance imparting member is attached to the first transmission line at a position the distance of which from the open end is equal to or larger than $\frac{1}{16}$ of the length of the first transmission line and is equal to or smaller than ($\frac{1}{3} + \frac{1}{4}$) thereof.

(Note 19) The wiring board according to Note 9, including the structural body according to any one of Notes 3 to 8 and 11 to 18.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

The invention claimed is:

1. A structural body comprising:
a first conductor;
a second conductor that is formed in a layer different from a layer in which the first conductor is formed, and that faces the first conductor;
a first transmission line that is formed in a layer different from the layers in which the first conductor and the second conductor are formed, that faces the second conductor, and that has one end being an open end,
a first conductor via connecting another end of the first transmission line and the first conductor; and
at least a capacitance imparting member that is physically connected to the first transmission line by a conductor and that forms a capacitance between the capacitance imparting member and the second conductor.

2. The structural body according to claim 1, wherein the first conductor, the second conductor, the first transmission line, the first conductor via, and the capacitance imparting member form an electromagnetic bandgap (EBG) structure.

3. The structural body according to claim 1, wherein the capacitance imparting member is a third conductor that is formed in a layer different from the layer in which the second conductor is formed and that faces the second conductor.

4. The structural body according to claim 1, wherein
the capacitance imparting member is a second transmission line, and
one end of the second transmission line is connected to the first transmission line, and another end thereof is an open end.

5. The structural body according to claim 1, wherein the capacitance imparting member is a chip capacitor.

6. The structural body according to claim 1, wherein, when the first transmission line has a length $l_{os}$, the capacitance imparting member is connected to the first transmission line at a position located between positions $(2k-2)l_{os}/2n-l_{os}/4n$ away and $(2k-2)l_{os}/(2n-1)+l_{os}/4n$ (for $k=2, \ldots, n$) from the open end or between positions $(2k-2)l_{os}/2n$ and $(2k-2)l_{os}/(2n-1)+l_{os}/4n$ (for $k=1$) away from the open end.

7. The structural body according to claim 1, wherein the capacitance imparting member is connected to the first transmission line at a position the distance of which from the open end is equal to or larger than 3/8 of the length of the first transmission line and is equal to or smaller than 19/24 thereof.

8. The structural body according to claim 1, wherein the capacitance imparting member is connected to the first transmission line at a position the distance of which from the open end is equal to or larger than 1/16 of the length of the first transmission line and is equal to or smaller than 7/12 thereof.

9. A wiring board comprising:
a first conductor;
a second conductor that is formed in a layer different from a layer in which the first conductor is formed, and that faces the first conductor;
a first transmission line that is formed in a layer different from the layers in which the first conductor and the second conductor are formed, that faces the second conductor, and that has one end being an open end;
a first conductor via that connects another end of the first transmission line and the first conductor; and
at least a capacitance imparting member that is physically connected to the first transmission line by a conductor and that forms a capacitance between the capacitance imparting member and the second conductor.

10. The wiring board according to claim 9, wherein the first conductor, the second conductor, the first transmission line, the first conductor via, and the capacitance imparting member form an electromagnetic bandgap (EBG) structure.

* * * * *